United States Patent
Kashihara et al.

(10) Patent No.: US 11,407,869 B2
(45) Date of Patent: Aug. 9, 2022

(54) PREPREG, METAL-CLAD LAMINATE AND PRINTED WIRING BOARD

(71) Applicant: PANASONIC INTELLECTUAL PROPERTY MANAGEMENT CO., LTD., Osaka (JP)

(72) Inventors: Keiko Kashihara, Osaka (JP); Rihoko Watanabe, Osaka (JP); Hiroharu Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 689 days.

(21) Appl. No.: 16/466,979

(22) PCT Filed: Dec. 7, 2017

(86) PCT No.: PCT/JP2017/043979
§ 371 (c)(1),
(2) Date: Jun. 5, 2019

(87) PCT Pub. No.: WO2018/105691
PCT Pub. Date: Jun. 14, 2018

(65) Prior Publication Data
US 2020/0087474 A1    Mar. 19, 2020

(30) Foreign Application Priority Data
Dec. 9, 2016    (JP) .............................. JP2016-239719

(51) Int. Cl.
*C08J 5/24* (2006.01)
*C08K 3/013* (2018.01)
(Continued)

(52) U.S. Cl.
CPC ................. *C08J 5/24* (2013.01); *C08K 3/013* (2018.01); *H05K 1/038* (2013.01); *H05K 3/022* (2013.01);
(Continued)

(58) Field of Classification Search
USPC .................. 174/258; 428/418; 523/466, 477; 156/60
See application file for complete search history.

(56) References Cited

U.S. PATENT DOCUMENTS 9,944,766 B2 *    4/2018    Matsumoto ............. B32B 27/28
2015/0037589 A1 *    2/2015    Inoue ................... H05K 1/0373
156/60
(Continued)

FOREIGN PATENT DOCUMENTS

JP    2006-137942 A    6/2006
JP    2007-138152 A    6/2007
(Continued)

OTHER PUBLICATIONS

"Functional Polymer by Suspension Polymerization: Teisanresin series", Nagase Chemtex Corporation, Apr. 18, 2016, (URL: www.nagasechemtex.co.jp/products/catalog/pdf/teisanresin.pdf), with English translation.
(Continued)

*Primary Examiner* — Lynda Salvatore
(74) *Attorney, Agent, or Firm* — McDermott Will & Emery LLP

(57) ABSTRACT

Disclosed herein is a prepreg including a woven fabric base and a semi-cured product of a resin composition impregnated into the woven fabric base. The resin composition contains a maleimide resin as Component (A), an acrylic resin as Component (B), and a phenol resin as Component
(Continued)

(C). The Component (B) has a weight average molecular weight falling within the range from 200,000 to 850,000.

9 Claims, 6 Drawing Sheets

(51) Int. Cl.
  *H05K 1/03*  (2006.01)
  *H05K 3/02*  (2006.01)
(52) U.S. Cl.
  CPC ........ *C08J 2333/08* (2013.01); *C08J 2379/00* (2013.01)

(56) References Cited

U.S. PATENT DOCUMENTS

| | | | |
|---|---|---|---|
| 2016/0017141 A1* | 1/2016 | Matsumoto | C08L 65/00 523/467 |
| 2016/0143135 A1 | 5/2016 | Inoue et al. | |
| 2017/0218150 A1 | 8/2017 | Matsumoto et al. | |

FOREIGN PATENT DOCUMENTS

| | | |
|---|---|---|
| JP | 2008-007756 A | 1/2008 |
| JP | 2011-162615 A | 8/2011 |
| JP | 2014-193994 A | 10/2014 |
| JP | 2015-044969 A | 3/2015 |
| JP | 2015-089622 A | 5/2015 |
| JP | 2016-047921 A | 4/2016 |
| JP | 2016-196557 A | 11/2016 |
| WO | 2017/209093 A1 | 12/2017 |
| WO | 2018/021113 A1 | 2/2018 |

OTHER PUBLICATIONS

International Search Report and Written Opinion issued in International Patent Application No. PCT/JP2017/043979, dated Mar. 13, 2018; with partial English translation.

* cited by examiner

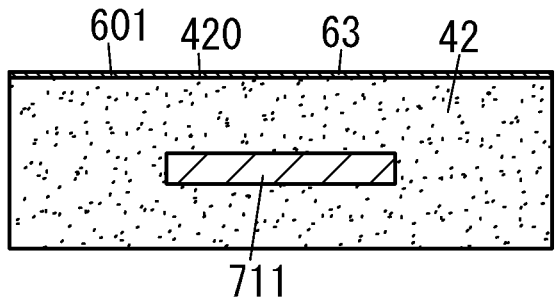
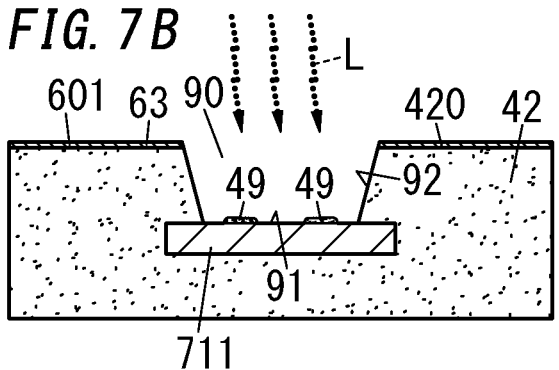
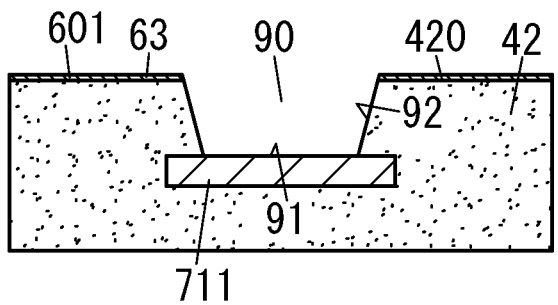
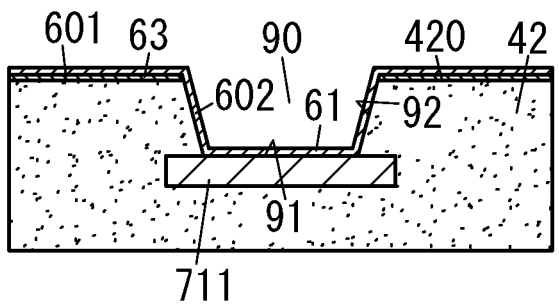
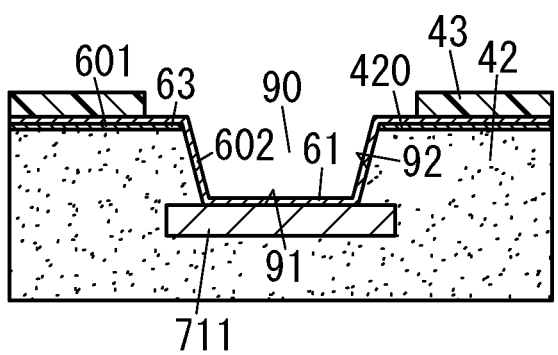
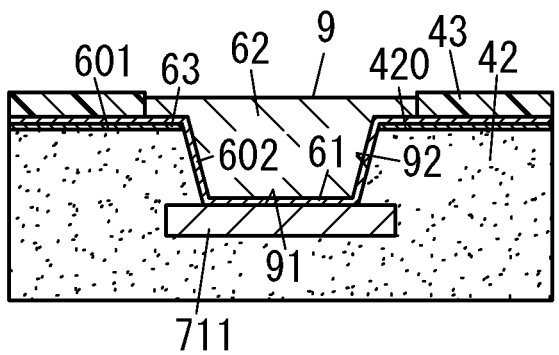
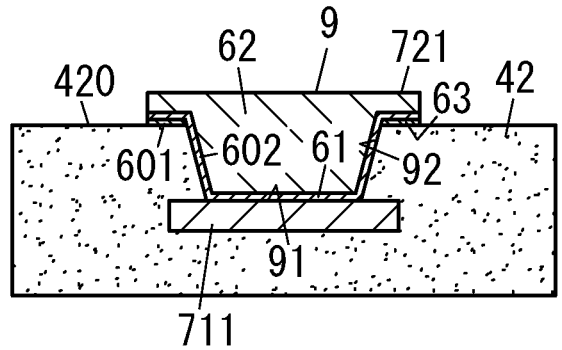

PREPREG, METAL-CLAD LAMINATE AND PRINTED WIRING BOARD

CROSS-REFERENCE OF RELATED APPLICATIONS

This application is the U.S. National Phase under 35 U.S.C. § 371 of International Patent Application No. PCT/JP2017/043979, filed on Dec. 7, 2017, which in turn claims the benefit of Japanese Application No. 2016-239719, filed on Dec. 9, 2016, the entire disclosures of which Applications are incorporated by reference herein.

TECHNICAL FIELD

The present disclosure generally relates to a prepreg, a metal-clad laminate, and a printed wiring board. More particularly, the present disclosure relates to a prepreg including a woven fabric base and a semi-cured product of a resin composition, a metal-clad laminate including a cured product of the prepreg and a metal layer, and a printed wiring board including the cured product of the prepreg and a patterned conductor.

BACKGROUND ART

A known prepreg is formed by impregnating a woven fabric base with a resin composition containing a thermosetting resin and heating and drying the base until the resin composition turns semi-cured (see, for example, Patent Documents 1 to 3). A metal-clad laminate may be fabricated by cladding the prepreg thus formed with metal foil and forming the foil-cladded prepreg into a desired shape under heat and pressure. Furthermore, a printed wiring board may be fabricated by forming a patterned conductor with excessive portions of the metal foil removed from the metal-clad laminate. Thereafter, semiconductor devices are mounted and assembled together on the printed wiring board and then the assembly is encapsulated to obtain a package.

Recently, so-called "package on package (PoP)" is often used as a package for smartphones, tablet PCs, and other telecommunications devices. Such a PoP includes a plurality of sub-packages that are stacked one on top of another. Therefore, the mountability (or stackability) of those sub-packages and the reliability of electrical conduction of each of those sub-packages are key factors that determine its product quality. Their mountability and reliability of electrical conduction will improve as the absolute value of warpage at room temperature of the package (including sub-packages) decreases and as the variation to be caused in the warpage by raising the ambient temperature from room temperature to 260° C. becomes less significant. Therefore, research and development are currently being conducted extensively to obtain a substrate material that would reduce the warpage of the package.

Substrate materials that are currently being proposed for use to reduce the warpage of the package have been developed to have high rigidity and a low coefficient of thermal expansion (CTE). That is to say, those proposals assume that the higher the rigidity is and the lower the CTE is, the less significant the warpage of the package should be.

It was certainly confirmed that such high-rigidity, low-CTE materials achieved the advantage of reducing the warpage of packages in a particular shape. Nevertheless, once the shape of a package is changed, the package will exhibit a totally different warpage behavior. Thus, such materials lack versatility.

In addition, most of known substrate materials like that include an epoxy resin and a phenol resin as their main components, which would make the chances of further improving the electrical characteristics (e.g., in terms of dielectric property) of the cured product very slim. Among other things, their high dielectric loss tangent would cause increased transmission loss of signals. To overcome such a problem, their high dielectric loss tangent could be lowered by adding plenty of inorganic fillers such as silica to the substrate material. However, a substrate material with a lot of inorganic fillers added tends to be a high-rigidity, low-CTE material such as the one described above, thus making it difficult to reduce the warpage, irrespective of the shape of the packages.

CITATION LIST

Patent Literature

Patent Document 1: JP 2006-137942 A
Patent Document 2: JP 2007-138152 A
Patent Document 3: JP 2008-007756 A

SUMMARY OF INVENTION

It is therefore an object of the present disclosure to provide a prepreg, a metal-clad laminate, and a printed wiring board, all of which are configured to reduce the warpage of the package and realize a low dielectric constant and a low dielectric loss tangent.

A prepreg according to an aspect of the present disclosure includes a woven fabric base and a semi-cured product of a resin composition impregnated into the woven fabric base. The resin composition contains a maleimide resin as Component (A), an acrylic resin as Component (B), and a phenol resin as Component (C). The Component (B) has structures expressed by at least Formulae (b2) and (b3), respectively, among the following Formulae (b1), (b2), and (b3) and has a weight average molecular weight falling within the range from 200,000 to 850,000.

[Chemical Formula 1]

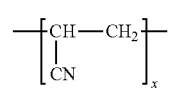
(b1)

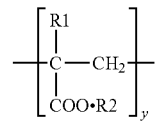
(b2)

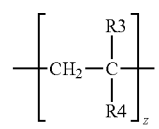
(b3)

x in Formula (b1), y in Formula (b2), and z in Formula (b3) satisfy the following relation x:y:z (in mole fractions)=0:0.95:0.05 to 0.2:0.6:0.2 (where $x+y+z \leq 1$, $0 \leq x \leq 0.2$, $0.6 \leq y \leq 0.95$, and $0.05 \leq z \leq 0.2$). In Formula (b2), R1 is either a hydrogen atom or a methyl group and R2 is selected from the group consisting of a hydrogen atom, an alkyl group, a glycidyl group, and an epoxidized alkyl group and includes at least one of the glycidyl group or the epoxidized alkyl group. In Formula (b3), R3 is either a hydrogen atom or a methyl group, and R4 is Ph (a phenyl group), —COOCH$_2$Ph, or —COO(CH$_2$)$_2$Ph.

A metal-clad laminate according to another aspect of the present disclosure includes: a cured product of the prepreg; and a metal layer provided for the cured product.

A printed wiring board according to still another aspect of the present disclosure includes a cured product of the prepreg; and a patterned conductor provided for the cured product.

BRIEF DESCRIPTION OF DRAWINGS

FIGS. 7A-7G are schematic cross-sectional views illustrating a series of process steps of a modified semi-additive process;

DESCRIPTION OF EMBODIMENTS

[Prepreg]

Figure 1:
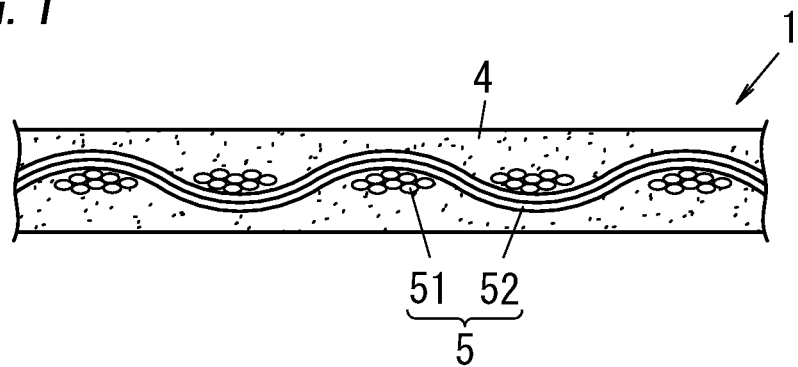
FIG. 1 is a schematic cross-sectional view illustrating a prepreg according to an embodiment of the present disclosure.

FIG. 1 illustrates a prepreg 1 according to an exemplary embodiment. The prepreg 1 is in the shape of a sheet. The prepreg 1 includes a woven fabric base 5 and a semi-cured product 4 of a resin composition impregnated into the woven fabric base 5. A sheet of the prepreg 1 may include a single woven fabric base 5 or two or more woven fabric bases 5.

As used herein, the "semi-cured product 4 of a resin composition" refers to a resin composition in an intermediate stage of its curing reaction. The intermediate stage is also called "Stage B," which is a stage between Stage A in the state of a varnish and Stage C in a fully cured state. Further heating a resin composition in this stage allows the resin composition to melt once and then be cured fully to turn into a cured product. Note that the prepreg 1 being in the semi-cured state means that the resin composition forming part of the prepreg 1 is in the semi-cured state. Also, a cured product of the prepreg 1 herein means that, the resin composition forming part of the prepreg 1 is in a fully cured state.

The resin composition will be described. The resin composition contains a maleimide resin as Component (A), an acrylic resin as Component (B), and a phenol resin as Component (C). These components of the resin composition will be described one by one.

A maleimide resin as Component (A) will be described. Component (A) is a high rigidity component. Component (A) is a prepolymer including two or more maleimide groups in a single molecule. This prepolymer may consist of either monomers or oligomers only or may include a mixture of a monomer and an oligomer. The maleimide group is a functional group that characterizes Component (A). The equivalent of the maleimide group as Component (A) suitably falls within the range from 100 g/eq to 500 g/eq, and more suitably falls within the range from 130 g/eq to 400 g/eq. The equivalent of the maleimide group means the mass of Component (A) including one equivalent of the maleimide group. The smaller the equivalent of the maleimide group is, the higher the concentration of the maleimide group is. The larger the equivalent of the maleimide group is, the lower the concentration of the maleimide group is.

The weight average molecular weight of Component (A) suitably falls within the range from 200 to 8,000, more suitably falls within the range from 300 to 3,000, and even more suitably falls within the range from 800 to 1,200. The significant digits of the weight average molecular weight are two digits. The weight average molecular weight may be measured, for example, by gel permeation chromatography (GPC).

Component (A) has excellent dielectric properties. Thus, adding Component (A) to a resin composition as a material for the prepreg 1 would make the dielectric constant and dielectric loss tangent of the printed wiring board 3 low enough. This would increase the propagation rate of signals and would cut down the transmission loss of signals even when the frequency of radio waves used is shifted to a high frequency range. In addition, Component (A) also has excellent heat resistance, thus improving the heat resistance of the printed wiring board 3 as well. Besides, Component (A) has better flame retardant properties than an epoxy resin, thus improving the flame retardant properties of the printed wiring board 3 as well.

Component (A) suitably includes one or more skeletons selected from the group consisting of a phenyl methane skeleton, an alkylated phenyl methane skeleton, and a biphenyl skeleton.

Component (A) including the phenyl methane skeleton will be described. Examples of the phenyl methane skeleton include a monophenyl methane skeleton, a diphenyl methane skeleton, a triphenyl methane skeleton, and a tetraphenyl methane skeleton. For example, Component (A) including the diphenyl methane skeleton has a structure in which each hydrogen atom of two benzene rings that form the diphenyl methane skeleton is replaced with a maleimide group.

As can be seen, Component (A) including the phenyl methane skeleton increases the solubility of the resin composition in a solvent when a varnish is prepared as will be described later. In particular, the solubility of the resin composition in a solvent with a low boiling point is so good that there is no need to use any solvent with a high boiling point. Using a solvent with a low boiling point instead of a solvent with a high boiling point reduces the amount of the residual solvent in the metal-clad laminate 2 and the printed wiring board 3. In the following description, the metal-clad laminate 2 and the printed wiring board 3 will be hereinafter collectively referred to as "substrates."

These two solvents with mutually different boiling points will be described by way of specific examples. Component (A) including the phenyl methane skeleton is soluble in both methyl ethyl ketone (MEK) with a boiling point of 79.5° C. and N, N-dimethyl formamide (DMF) with a boiling point of 153° C. In this embodiment, a varnish is suitably prepared with Component (A) dissolved in methyl ethyl ketone (MEK). This reduces the residual solvent in the substrates, and increases the environmental friendliness of a working environment, compared to using N, N-dimethyl formamide (DMF).

Next, Component (A) including the alkylated phenyl methane skeleton will be described. Examples of the alkylated phenyl methane skeleton include an alkylated monophenyl methane skeleton, an alkylated diphenyl methane skeleton, an alkylated triphenyl methane skeleton, and an alkylated tetraphenyl methane skeleton. For example, Component (A) including the alkylated diphenyl methane skeleton has a structure in which each hydrogen atom of two benzene rings that form the diphenyl methane skeleton is replaced with a maleimide group and at least one hydrogen atom of these benzene rings is replaced with an alkyl group. Specific examples of the alkyl groups include lower alkyl groups C1-C4, examples of which include a methyl group and an ethyl group.

As can be seen, Component (A) including the alkylated phenyl methane skeleton further improves the dielectric properties. Specifically, in that case, even though the dielectric loss tangent does not change significantly, the dielectric constant decreases, thus eventually increasing the propagation rate of signals and cutting down the transmission loss of signals as well.

Next, Component (A) including the biphenyl skeleton will be described. The biphenyl skeleton has a structure in which two benzene rings form a single bond between themselves. Component (A) including the biphenyl skeleton would achieve the same advantages as Component (A) including the phenyl methane skeleton. In addition, Component (A) including the biphenyl skeleton has even better dielectric properties than Component (A) including the phenyl methane skeleton or the alkylated phenyl methane skeleton.

Next, the acrylic resin as Component (B) will be described. Component (B) has structures expressed by at least Formulae (b2) and (b3), respectively, among the following Formulae (b1), (b2), and (b3). Component (B) is a component with low elasticity. Specific examples of Component (B) include an epoxy modified acrylic resin.

[Chemical Formula 2]

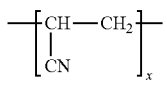

(b1)

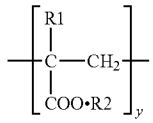

(b2)

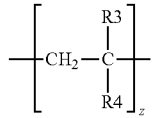

(b3)

x in Formula (b1), y in Formula (b2), and z in Formula (b3) satisfy the following relation x:y:z (in mole fractions)= 0:0.95:0.05 to 0.2:0.6:0.2 (where $x+y+z \leq 1$, $0 \leq x \leq 0.2$, $0.6 \leq y \leq 0.95$, and $0.05 \leq z \leq 0.2$). In Formula (b2), R1 is either a hydrogen atom or a methyl group and R2 is selected from the group consisting of a hydrogen atom, an alkyl group, a glycidyl group, and an epoxidized alkyl group and includes at least one of the glycidyl group or the epoxidized alkyl group. In Formula (b3), R3 is either a hydrogen atom or a methyl group, and R4 is Ph (a phenyl group), —COOCH$_2$Ph, or —COO(CH$_2$)$_2$Ph.

The main chain of Component (B) has structures expressed by at least Formulae (b2) and (b3), respectively, among these Formulae (b1), (b2), and (b3).

If the main chain of Component (B) has structures expressed by Formulae (b1), (b2) and (b3), respectively, the order of arrangement of the respective structures expressed by Formulae (b1), (b2), and (b3) is not particularly limited. In that case, in the main chain of Component (B), the structures expressed by Formula (b1) may or may not be continuous with each other, the structures expressed by Formula (b2) may or may not be continuous with each other, and the structures expressed by Formula (b3) may or may not be continuous with each other.

If the main chain of Component (B) has structures expressed by Formulae (b2) and (b3), respectively, the order of arrangement of the respective structures expressed by Formulae (b2), and (b3) is not particularly limited. In that case, in the main chain of Component (B), the structures expressed by Formula (b2) may or may not be continuous with each other, and the structures expressed by Formula (b3) may or may not be continuous with each other.

The significance of R2 in Formula (b2) including at least one of a glycidyl group or an epoxidized alkyl group among a hydrogen atom, an alkyl group, the glycidyl group, and the epoxidized alkyl group will be described as supplemental description. The premise is that R2 in the structure expressed by the single Formula (b2) is a single ingredient. In the following description, a situation where Component (B) has one structure expressed by Formula (b2) and a situation where Component (B) has two or more structures expressed by Formula (b2) will be described separately.

In the former case, i.e., if Component (B) has one structure expressed by single Formula (b2), R2 is either a glycidyl group or an epoxidized alkyl group.

In the latter case, i.e., if Component (B) has structures expressed by two or more Formulae (b2), respectively, then R2 in the structure expressed by at least one Formula (b2) is either a glycidyl group or an epoxidized alkyl group, while R2 in the structures expressed by the other Formula (or Formulae) (b2) is either a hydrogen atom or an alkyl group. Since R2 in the structure expressed by at least one Formula (b2) is either a glycidyl group or an epoxidized alkyl group, R2 in the structures expressed by all Formulae (b2) may also be either a glycidyl group or an epoxidized alkyl group.

The structure expressed by Formula (b3) includes Ph (a phenyl group), —COOCH$_2$Ph, or —COO(CH$_2$)$_2$Ph. Ph, —COOCH$_2$Ph, and —COO(CH$_2$)$_2$Ph are thermally stable enough to increase the strength of a cured product of the prepreg 1. This increases the moisture-heat resistance of substrates fabricated using the prepreg 1 as a material.

Component (B) suitably has no unsaturated bonds (which may be double bonds or triple bonds) between adjacent carbon atoms. That is to say, in Component (B), adjacent carbon atoms are suitably bonded together with a saturated bond (single bond). This reduces oxidation with time, thus reducing an increase in brittleness due to the loss of elasticity.

Component (B) has a weight average molecular weight (Mw) falling within the range from 200,000 to 850,000. The significant digits of the weight average molecular weight are two digits. That is to say, even a numeral value, which is rounded off to either 200,000 to 850,000 by rounding the third digit (in the thousands place), also falls within the range from 200,000 to 850,000. If the weight average molecular weight of Component (B) were less than 200,000, then the chemical resistance could deteriorate. Conversely, if the weight average molecular weight of Component (B) were more than 850,000, then the moldability could deteriorate. For these reasons, the weight average molecular weight (Mw) of Component (B) suitably falls within the range from 200,000 to 500,000 and more suitably falls within the range from 300,000 to 500,000.

Adding Component (B) to the resin composition decreases the moisture absorption of the cured product of the prepreg 1, thus increasing the moisture resistance of the substrates and eventually improving the insulation reliability. In addition, even if the cured product of the prepreg 1 absorbs moisture, the moisture-heat resistance of the substrates are still improvable, because the breaking strength of the resin that forms part of the cured product has been increased. Particularly, even in a thick printed wiring board including an insulating layer with a thickness of 0.2 mm or more, the moisture-heat resistance thereof have been improved sufficiently to reduce the expansion under heat of the insulating layer due to soldering, for example. Naturally, the moisture-heat resistance of a thin printed wiring board including an insulating layer with a thickness less than 0.2 mm or less have also been improved.

Component (B) is a prepolymer having at least one epoxy group in a single molecule. The epoxy group is one kind of functional group contained in Component (B). The equivalent of the epoxy group in Component (B) suitably falls within the range from 1,250 g/eq to 100,000 g/eq, and more suitably falls within the range from 2,500 g/eq to 7,000 g/eq. As used herein, the equivalent of the epoxy group means the mass of Component (B) including one equivalent of the epoxy group. The smaller the equivalent of the epoxy group is, the higher the concentration of the epoxy group is. The larger the equivalent of the epoxy group is, the lower the concentration of the epoxy group is.

In this embodiment, Components (A) and (C) and Component (B) are suitably in a phase separation state, instead of exhibiting compatibility, when the resin composition is semi-cured or cured. This curbs the decrease in the glass transition temperature (Tg) of a cured product of the prepreg 1, thus increasing the heat resistance (e.g., solder heat resistance) of the substrates and the package.

The epoxy value of Component (B) suitably falls within the range from 0.01 eq/kg to 0.80 eq/kg. As used herein, the "epoxy value" refers to the number of equivalents of the epoxy group in 1 kg of Component (B). Component (B) having an epoxy value falling within this range makes Components (A) and (C) less easily compatible with Component (B). This curbs a decrease in the glass transition temperature (Tg) of a cured product of the prepreg 1 and increases the heat resistance of the substrates and the package. The epoxy value of Component (B) more suitably falls within the range from 0.06 eq/kg to 0.40 eq/kg and even more suitably falls within the range from 0.14 eq/kg to 0.28 eq/kg.

Next, a phenol resin as Component (C) will be described. Component (C) is a high rigidity component. Component (C) may serve as a curing agent for Components (A) and (B). That is to say, Component (C) may react to each of Components (A) and (B).

Component (C) includes a novolak resin and a resole resin. The novolak resin is a resin produced by synthesizing together phenols and formaldehyde as materials in the presence of an acid catalyst. The resole resin is a resin produced by synthesizing together phenols and formaldehyde as materials in the presence of an alkali catalyst. The phenols include an organic compound in which one or more hydrogen atoms of the benzene are replaced with a hydroxy group. Specific examples of the phenols include phenol and cresol.

Component (C) includes, in a single molecule, at least two hydroxy groups (which will be hereinafter referred to as "hydroxyl groups" or "phenolic hydroxyl groups). The hydroxy group is one kind of functional group contained in Component (C). The equivalent of the hydroxy group in Component (C) suitably falls within the range from 100 g/eq to 500 g/eq, and more suitably falls within the range from 150 g/eq to 400 g/eq. The equivalent of the hydroxy group means the mass of Component (C) including one equivalent of the hydroxy group. The smaller the equivalent of the hydroxy group is, the higher the concentration of the hydroxy group is. The larger the equivalent of the hydroxy group is, the lower the concentration of the hydroxy group is.

The weight average molecular weight of Component (C) suitably falls within the range from 200 to 8,000, and more suitably falls within the range from 300 to 3,000. The significant digits of the weight average molecular weight are two digits.

Component (C) suitably includes one or more resins selected from the group consisting of a naphthalene skeleton containing phenol resin, a naphthalene skeleton containing cresol resin, a biphenyl skeleton containing phenol resin, a biphenyl skeleton containing cresol resin, and an allyl phenol resin.

Component (C) including at least one resin selected from the group consisting of a naphthalene skeleton containing phenol resin, a naphthalene skeleton containing cresol resin, a biphenyl skeleton containing phenol resin, and a biphenyl skeleton containing cresol resin increases the heat resistance (e.g., solder heat resistance) of a cured product of the prepreg 1. Since the prepreg 1 is a material for the metal-clad laminate 2, the printed wiring board 3, and the package, Component (C) including such a resin also increases their heat resistance. Component (C) including an allyl phenol resin produces a reaction not only between the maleimide group as Component (A) and the hydroxy group as Component (C) but also between the maleimide group as Component (A) and an allyl group of the allyl phenol resin as well, thus further increasing the glass transition temperature (Tg) of the cured product of the prepreg 1.

Component (C) suitably includes a phosphorus-containing phenol resin. This increases the flame retardant property of a cured product of the prepreg 1. Since the prepreg 1 is a material for the metal-clad laminate 2, the printed wiring board 3, and the package, Component (C) including a phosphorus-containing phenol resin also increases their flame retardant property.

The compounding ratio of Components (A), (B), and (C) in the resin composition will be described. The ratio of the equivalent of Component (C) to the total equivalent of Components (A) and (B) suitably falls within the range from 0.8:1 to 1.2:1 In other words, the ratio of the equivalent of Component (C) to the total equivalent of Components (A) and (B) falls within the range from 0.8 to 1.2. As used herein, the total equivalent of Components (A) and (B) is the sum of the equivalent of the maleimide group as Component (A) and the equivalent of the epoxy group as Component (B). The equivalent of Component (C) is the equivalent of the hydroxy group as Component (C). Setting the ratio of the equivalent of Component (C) to the total equivalent (of 1) of Components (A) and (B) at 0.8 or more promotes the reaction between Components (A) and (C) with the self-polymerization of Component (A) reduced, thus further improving the electrical characteristics (among other things, the dielectric property) of the resin composition. Setting the ratio of the equivalent of Component (C) to the total equivalent (of 1) of Components (A) and (B) at 1.2 or less further improves the heat resistance of the resin composition with Component (C) and other non-reactants reduced.

The resin composition suitably further includes an inorganic filler as Component (D).

An inorganic filler as Component (D) will be described. The inorganic filler is an aggregate of fine particles of an inorganic substance. Specific examples of the inorganic fillers include spherical silica, barium sulfate, silicon oxide powder, crushed silica, calcined talc, barium titanate, titanium oxide, clay, alumina, mica, boehmite, zinc borate, zinc stannate, and other metal oxides and metal hydrates.

It is recommended that the resin composition substantively contain no inorganic fillers with a mean particle size of 45 μm or more. As used herein, if something does not substantively contain some ingredient, then the content of the ingredient may be exactly equal to zero or the ingredient may also be contained in a very small amount as an inevitable impurity, for example. The resin composition substantively containing such coarse particles could cause a significant decline in the insulation reliability of thin materials (such as the prepreg 1, the metal-clad laminate 2, and the printed wiring board 3), in particular. Note that the mean particle size refers herein to a particle size at an integrated value of 50% in a particle size distribution obtained by laser diffraction and scattering method.

Component (D) suitably includes Component (D1). Component (D1) is a filler obtained by subjecting the inorganic filler to surface treatment with a silane coupling agent expressed by the following Formula (d1). In the following description, the silane coupling agent expressed by Formula (d1) will be sometimes hereinafter referred to as a "first silane coupling agent." Also, the inorganic filler subjected to surface treatment with the first silane coupling agent will be sometimes hereinafter referred to as a "first inorganic filler." Furthermore, a filler obtained by subjecting the first inorganic filler to surface treatment with the first silane coupling agent will be sometimes hereinafter referred to as a "first filler." That is to say, the first inorganic filler is an aggregate of fine particles. On the surface of those fine particles, the first silane coupling agent is bonded with their reaction group (which is silanol produced by hydrolysis of a methoxy group or an ethoxy group). The first filler as Component (D1) is formed in this manner.

[Chemical Formula 3]

$$(R6)Si(R5)_3 \qquad (d1)$$

In Formula (d1), R5 is either a methoxy group or an ethoxy group, and R6 has an isocyanate group, a glycidyl group, or an amino group at an end of an aliphatic alkyl group with a carbon number of 3 to 18.

The first silane coupling agent is trifunctional alkoxy silane in which an aliphatic alkyl group with a particular number of carbon atoms, including a particular functional group (which may be an isocyanate group, a glycidyl group, or an amino group) at an end, is bonded to a silicon atom.

Specific examples of the silane coupling agent including an isocyanate group at an end of an aliphatic alkyl group include 3-isocyanatepropyltriethoxy silane.

Specific examples of the silane coupling agent including a glycidyl group at an end of an aliphatic alkyl group include 3-glycidoxypropyltrimethoxy silane, 3-glycidoxypropyltriethoxy silane, and 3-glycidoxyoctyltrimethoxy silane.

Specific examples of the silane coupling agent including an amino group at an end of an aliphatic alkyl group include N-2-(aminoethyl)-3-aminopropyltrimethoxy silane, 3-aminopropyltrimethoxy silane, 3-aminopropyltriethoxy silane and N-phenyl-3-aminopropyltrimethoxy silane.

When the first inorganic filler is subjected to surface treatment with the first silane coupling agent, the aliphatic alkyl group with a particular number of carbon atoms will be present on the surface of the respective fine particles that form the first filler. To an end of this aliphatic alkyl group, bonded is an isocyanate group, a glycidyl group, or an amino group. These reaction groups have high affinity with the maleimide resin as Component (A) and the phenol resin as Component (C). Therefore, these reaction groups allow the first filler as Component (D1), the maleimide resin as Component (A), and the phenol resin as Component (C) to be bonded with each other. Note that Component (B) is epoxy modified (see Formula (b2)) but has low affinity with Component (D1) because its amount is small. Therefore, when the resin composition is semi-cured or cured, Components (A) and (C) and Component (B) tend to have a phase-separated structure without exhibiting compatibility.

The aliphatic alkyl group of the reaction group R6 of the first silane coupling agent suitably has 3 to 18 carbon atoms. If the number of carbon atoms that the aliphatic alkyl group has were less than three, then the cured product of the prepreg 1 would have excessive elasticity.

Component (D) suitably includes Component (D2). Component (D2) is a filler obtained by subjecting the inorganic filler to surface treatment with a silane coupling agent expressed by the following Formula (d2). In the following description, the silane coupling agent expressed by Formula (d2) will be sometimes hereinafter referred to as a "second silane coupling agent." Also, the inorganic filler subjected to surface treatment with the second silane coupling agent will be sometimes hereinafter referred to as a "second inorganic filler." Furthermore, a filler obtained by subjecting the second inorganic filler to surface treatment with the second silane coupling agent will be sometimes hereinafter referred to as a "second filler." That is to say, the second inorganic filler is an aggregate of fine particles. Onto the surface of those fine particles, the second silane coupling agent is bonded with its reaction group (which is either a methoxy group or an ethoxy group). The second filler as Component (D2) is formed in this manner.

[Chemical Formula 4]

$$(R8)Si(R7)_3 \qquad (d2)$$

In Formula (d2), $R_7$ is either a methoxy group or an ethoxy group, and $R_8$ has a methacryloyl group or a vinyl group at an end of an aliphatic alkyl group with a carbon number of 3 to 18.

The second silane coupling agent is trifunctional alkoxy silane in which an aliphatic alkyl group with a particular number of carbon atoms, including a particular functional group (which may be either a methacryloyl group or a vinyl group) at an end, is bonded to a silicon atom. Note that the methacryloyl group is trivially called a "methacrylic group."

Specific examples of the silane coupling agent including a methacryloyl group at an end of an aliphatic alkyl group include 3-methacryloxypropyltrimethoxy silane, 3-methacryloxypropyltriethoxy silane, and 3-methacryloxyoctyltrimethoxy silane.

Specific examples of the silane coupling agent including a vinyl group at an end of an aliphatic alkyl group include vinyltrimethoxy silane and vinyltriethoxy silane.

When the second inorganic filler is subjected to surface treatment with the second silane coupling agent, the aliphatic alkyl group with a particular number of carbon atoms will be present on the surface of the respective fine particles that form the second filler. To an end of this aliphatic alkyl group, bonded is either a methacryloyl group or a vinyl group. These reaction groups have high affinity with Component (B). Therefore, these reaction groups allow Components (D2) and (B) to be bonded together.

The aliphatic alkyl group of the reaction group $R_8$ of the second silane coupling agent suitably has 3 to 18 carbon atoms. If the number of carbon atoms that the aliphatic alkyl group has were less than three, then the cured product of the prepreg 1 would have excessive elasticity.

Component (D) more suitably includes both of Components (D1) and (D2) for the following reasons.

Generally speaking, in a cured product of a resin composition containing a resin and an inorganic filler, the resin tends to absorb more moisture than the inorganic filler does. Therefore, if the inorganic filler is dispersed non-uniformly in the cured product of the resin composition, then a lot of resin will be present in a portion where the inorganic filler is sparse, thus absorbing a lot of water there. On the other hand, plenty of resin will not be present in a portion where the inorganic filler is dense, thus absorbing less water. That is to say, non-uniform dispersion of the inorganic filler makes the dispersion of water absorbed non-uniform as well. When a cured product of such a resin composition is subjected to a moisture/heat resistance test, the result will be that water will be present non-uniformly and the localized water will vaporize to cause swelling.

In contrast, adding both of Components (D1) and (D2) as Component (D) improves the moisture-heat resistance for the following reason. Specifically, Component (D1) has high affinity with Components (A) and (C), while Component (D2) has high affinity with Component (B). This reduces the chances of the entire Component (D) being locally distributed closer to Components (A) and (C) or distributed closer to Component (B). That is to say, this allows the entire Component (D) to be distributed uniformly in the cured product of the resin composition, and therefore, allows water to be dispersed and absorbed uniformly as well. This reduces not only the localization of water but also the chances of swelling, thus improving the moisture-heat resistance.

In addition, adding the first filler of Component (D1) and the second filler of Component (D2) to the resin composition increases the dimensional stability of the substrates as well.

Next, common feature of the first filler of Component (D1) and the second filler of Component (D2) will be described. In the following description, the first filler and the second filler will be hereinafter collectively referred to as "fillers" if there is no need to distinguish these fillers from each other. Likewise, the first inorganic filler and the second inorganic filler will be hereinafter collectively referred to as "inorganic fillers" if there is no need to distinguish these inorganic fillers from each other. Furthermore, the first silane coupling agent and the second silane coupling agent will be hereinafter collectively referred to as "silane coupling agents" if there is no need to distinguish these silane coupling agents from each other.

The aliphatic alkyl group has the capability of relieving the stress caused by the cured prepreg 1 during its thermal expansion or shrinkage. When the inorganic fillers are subjected to surface treatment with the silane coupling agents, a stress relieving layer produced from the aliphatic alkyl group will be formed on the surface of the inorganic fillers. Adding the fillers with the stress relieving layer to Components (A), (C), and (B) allows the stress applied to these Components (A), (C), and (B) due to thermal expansion or shrinkage to be relieved. This reduces the chances of the cured prepreg 1 with the fillers being thermally deformed. Thus, the moisture-heat resistance of the substrates are further improvable. The presence of the aliphatic alkyl group on the surface of the fillers would relieve the stress for several reasons. One reason is that the free rotational ability of the single bond of the alkyl group would allow the alkyl group of the filler to expand or shrink thermally, as Components (A), (C), and (B) expand or shrink thermally.

In addition, the aliphatic alkyl group also has the capability of reducing the etch depth for a desmear process (desmear etching process) to be performed after the metal-clad laminate 2, formed using the prepreg 1 as a material, has been subjected to hole cutting.

In this case, the desmear process includes at least one of the following two processes. A first one of the two processes is the process of removing resin smears, produced during the hole cutting process step by laser cutting or drilling, by chemical hole cleaning, for example. A second one of the two processes is the process of roughening the surface of an insulating layer (hereinafter referred to as a "roughening process") before a seed layer (electroless plating layer) is formed during a semi additive process (SAP). The roughening process makes the surface of the insulating layer uneven and an anchoring effect increases the degree of close contact between the seed layer and the insulating layer. The semi additive process will be described in further detail later.

A specific desmear process may be potassium permanganate treatment, for example. In the potassium permanganate treatment, a desmear liquid, including alkali potassium permanganate as a main ingredient, is used.

The etch depth refers herein to the amount of the resin removed by the desmear process. An excessive etch depth could cause the following problems. Firstly, the excessive etch depth could increase the diameter of a hole cut by the hole cutting process step. Secondly, the excessive etch depth could increase the surface roughness of the insulating layer, which could make it difficult to form a fine line patterned conductor at a narrow pitch. For these reasons, the etch depth is suitably as small as possible.

The presence of the aliphatic alkyl group on the surface of the fillers as described above reduces the permeation of the desmear liquid into the cured product of the resin composition, thus decreasing the etch depth. This allows an increase in the diameter of the holes to be reduced even when the desmear process is carried out.

The aliphatic alkyl group has, at an end thereof, an isocyanate group, a glycidyl group, an amino group, a methacryloyl group, or a vinyl group, and these functional groups are bonded strongly to Component (A), (C), or (B). This allows the etch depth to be reduced at the time of the desmear process, compared to a situation where none of the isocyanate group, glycidyl group, amino group, methacryloyl group, or vinyl group is present at the end of the aliphatic alkyl group.

Examples of methods for subjecting the inorganic fillers to surface treatment with the silane coupling agents include a direct treatment method, an integral blending method, and a dry concentrate method. When the inorganic fillers are subjected to surface treatment with the silane coupling agents, the amount of the silane coupling agents added to the inorganic fillers is not particularly limited. The amount of the silane coupling agents to be added to form a single molecular layer of the silane coupling agents over the entire surface of the inorganic fillers may be calculated by the following Equation (1). A suitable amount of the silane coupling agents to be added is 0.1 to 15 times as large as the value calculated by the following equation. In that case, the fillers will relieve the stress even more effectively.

$$W_C = W_F \times S_F / S_C \tag{1}$$

where $W_C$ is the amount (g) of the silane coupling agents to be added to form a single molecular layer, $W_F$ is the amount (g) of the inorganic fillers added, $S_F$ is the specific surface area (m²/g) of the inorganic fillers, and $S_C$ is the minimum area (m²/g) covered by the silane coupling agents.

Either Component (D1) or Component (D2) is suitably a nanofiller with a mean particle size of 100 nm or less, and more suitably a nanofiller with a mean particle size falling within the range from 10 nm to 100 nm. In general, after holes have been cut through an insulating layer, resin smears are often deposited inside (e.g., at the bottom) of the holes. The smaller the diameter of the holes is, the more difficult it is to remove the resin smears. However, if either Component (D1) or Component (D2) has a mean particle size of 100 nm or less, those locally deposited resin smears are easily removable. The effect to be achieved by removing the resin smears will be described in further detail. The main component of the resin smears would be Component (B) that is a substance with a high molecular weight. If either Component (D1) or Component (D2) is the nanofiller described above (which will be hereinafter referred to as a "first situation"), the nanofiller will be dispersed uniformly in the resin smears. Such resin smears are easily removable by the desmear process. On the other hand, if neither Component (D1) nor Component (D2) is the nanofiller (which will be hereinafter referred to as a "second situation"), the resin smears will consist essentially of the resin component. Such resin smears are removable by tightening the condition of the desmear process compared to the first situation but are removable less easily when the desmear process is carried out under the same condition as in the first situation. That is to say, supposing the desmear process is carried out under the same condition, the resin smears are removable more easily in a situation where either Component (D1) or Component (D2) has a mean particle size of 100 nm or less than in a situation where both Component (D1) and Component (D2) have a mean particle size greater than 100 nm. The reason is that the nanofiller with a mean particle size of 100 nm or less would be dispersed uniformly in the resin smears as described above. Either Component (D1) or Component (D2) having a mean particle size of 10 nm or more would reduce the thickening of the resin composition in a varnish state. In the following description, the nanofiller without any modifier will refer herein to either the first filler or second filler, whichever has a mean particle size of 100 nm or less.

The content of Component (D) with respect to the entire resin composition is suitably 80% by mass or less, and more suitably 50% by mass or less. In this case, the content of Component (D) refers, when the inorganic fillers are subjected to surface treatment with the silane coupling agents, to the combined content of Component (D) with the silane coupling agents, which has been subjected to the surface treatment. The ratio (by mass) of Component (D1) to Component (D2) suitably falls within the range from 98:2 to 60:40 and more suitably falls within the range from 95:5 to 80:20. In other words, with respect to 100 parts by mass of Components (D1) and (D2) combined, the content of Component (D2) suitably falls within the range from 2 to 40 parts by mass, and more suitably falls within the range from 5 parts by mass to 20 parts by mass.

If either Component (D1) or Component (D2) is a nanofiller, then the content of the nanofiller suitably falls within the range from 1 part by mass to 30 parts by mass, and more suitably falls within the range from 3 parts by mass to 10 parts by mass, with respect to 100 parts by mass of Components (A), (B), and (C) combined. Adding at least 1 part by mass of the nanofiller would enhance the effect of removing the resin smears deposited inside of the holes that have been cut through the insulating layer. More specifically, supposing the desmear process is carried out under the same condition, the resin smears are removable more easily in a situation where the content of the nanofiller is equal to or greater than 1 part by mass than in a situation where the content of the nanofiller is less than 1 part by mass. As long as the content of the nanofiller is 30 parts by mass or less, thickening of the resin composition in the varnish state is reducible.

The resin composition may further contain some additive. Specific examples of the additives include a phosphorus-based flame retardant. Adding the phosphorus-based flame retardant to the resin composition would improve the flame retardant property of the cured product of the prepreg 1, the substrates, and the package. Note that even though the phosphorus-based flame retardant tends to absorb moisture, the phosphorus-based flame retardant may still be used in combination with Components (D1) and (D2) that would improve the moisture-heat resistance. The phosphorus-based flame retardant hardly affects the dispersion of Component (D). When a small part (such as a package) is fabricated with the resin composition, there is little need to impart the flame retardant property to that part. On the other hand, when a large part (such as a motherboard) is fabricated with the resin composition, there is much need to impart the flame retardant property to the part. That is why in the latter case, the phosphorus-based flame retardant is suitably added to the resin composition.

Optionally, the resin composition may further contain a curing accelerator (catalyst). Examples of the curing accelerators include imidazoles and derivatives thereof, organic phosphorus compounds (e.g., triphenylphosphine), metal soaps such as zinc octoate, secondary amines, tertiary amines, and quaternary ammonium salts.

Figure 2:
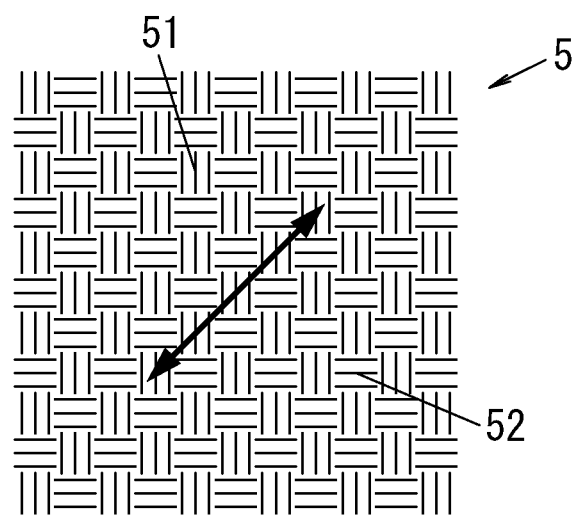
FIG. 2 is a schematic plan view illustrating a woven fabric base that forms part of the prepreg.

The woven fabric base 5 will be described. Any woven fabric may be used as the woven fabric base 5 without limitation as long as the warp 51 and woof 52 thereof are woven substantially perpendicularly to each other as shown in FIG. 2. Specific exemplary forms of weaving the woven fabric base 5 include a plain weave, a twill weave, and a satin weave. Specific examples of the woven fabric base 5 include a base made of an inorganic fiber such as glass cloth and a base made of an organic fiber such as aramid cloth. The woven fabric base 5 suitably has a thickness falling within the range from 10 μm to 200 μm.

Next, the physical properties of the prepreg 1 according to this embodiment will be described.

A dielectric loss tangent (tan δ) chart is obtained by dynamic mechanical analysis (DMA) of a cured product of the prepreg 1 as a sample. This chart (tan δ curve) suitably has a peak in a temperature range of 100° C. or less and another peak in a temperature range of 200° C. or more, and more suitably has a peak in a temperature range of 60° C. or less and another peak in a temperature range of 200° C. or more. The peak in the temperature range of 200° C. or more is a main dispersion peak. The main dispersion peak is related to the main chain movement of the molecular structure of the cured product and is caused by the glass transition temperature (Tg). On the other hand, the peak in the temperature range of 100° C. or less or in the temperature range of 60° C. or less is a sub-dispersion peak. The sub-dispersion peak is related to the side chain movement of the molecular structure of the cured product and is caused by Component (B) with a high molecular weight, among other things. Shifting the sub-dispersion peak from 100° C. or less to 60° C. or less (i.e., toward a range with lower temperatures) imparts a higher elongation characteristic and even lower elasticity to the cured product.

The dynamic mechanical analysis described above may be conducted at a constant frequency (of 10 Hz, for example). The dielectric loss tangent (tan δ) is the ratio of the loss modulus of elasticity (E") to the storage modulus of elasticity (E'). That is to say, the dielectric loss tangent (tan δ)=loss modulus of elasticity (E")/storage modulus of elasticity (E'). In a dielectric loss tangent (tan δ) chart, the ordinate thereof indicates the dielectric loss tangent (tan δ) and the abscissa thereof indicates the temperature to represent the temperature dependence of the dielectric loss tangent (tan δ).

In the cured state, the prepreg 1 has a loss modulus of elasticity (E")/storage modulus of elasticity (E') ratio of 0.05 or more suitably in a temperature range of 100° C. or less and a temperature range of 200° C. or more, and more suitably in a temperature range of 60° C. or less and a temperature range of 200° C. or more. The peak value of the dielectric loss tangent (tan δ) of the prepreg 1 is 0.05 or more suitably in both of the temperature range of 100° C. or less and the temperature range of 200° C. or more, and more suitably in both of the temperature range of 60° C. or less and the temperature range of 200° C. or more.

The dielectric loss tangent (tan δ) chart having a peak of 0.05 or more in the temperature range of 100° C. or less and another peak of 0.05 or more in the temperature range of 200° C. or more allows the prepreg 1 to have features of both of Components (A) and (C) that are high rigidity components and Component (B) that is a low elasticity component. In addition, shifting the sub-dispersion peak from 100° C. or less to 60° C. or less (i.e., toward a range with lower temperatures) as described above imparts a higher elongation characteristic and an even lower elasticity to the cured product.

Furthermore, in the cured state, the prepreg 1 suitably has a tensile elongation of 5% or more in a direction forming a tilt angle of 45 degrees with respect to the warp 51 or woof 52 of the woven fabric base 5 (e.g., in the directions indicated by the double-headed arrow in FIG. 2). The tensile elongation is usually measured with a sheet of prepreg 1 in the cured state (in Stage C) used as a sample. Alternatively, the sample may also be multiple sheets of prepreg 1 that are stacked one on top of another such that the directions in which their warps 51 extend agree with each other and the directions in which their woofs 52 extend agree with each other, and then cured.

The tensile elongation may be measured by a tensile test conducted in the following manner. First, before the tensile test is conducted, the length ($L_0$) of the sample is measured in a direction that forms a tilt angle of 45 degrees with respect to the warp 51 or the woof 52. In this case, the width of the sample is adjusted to 5 mm Next, the sample is pulled at a velocity of 5 mm/min in the direction forming a tilt angle of 45 degrees with respect to the warp 51 or the woof 52 using a tensile tester, thereby measuring the length (L) of the sample just before the sample is broken. Then, the tensile elongation may be calculated by the following Equation (2):

$$\text{Tensile elongation (\%)} = \{(L-L_0)/L_0\} \times 100 \tag{2}$$

The tensile elongation obtained in this manner being 5% or more allows the warpage of the package to be further reduced.

[Method of Producing Prepreg]

First of all, a varnish of the resin composition is prepared. Components (A), (B), and (C) are added to, and dissolved in, a solvent, and then compounded with an additive and a curing accelerator added thereto as needed, thereby preparing a base varnish. In this case, examples of solvents used for preparation include acetone, ketone solvents such as methyl ethyl ketone and cyclohexanone, aromatic solvents such as toluene and xylene, and a nitrogen-containing solvent such as dimethylformamide.

Unless Component (D) is used, the base varnish thus obtained is used as a varnish for the resin composition.

When Component (D) is used, a varnish of the resin composition may be prepared by adding Component (D) to the base varnish and allowing Component (D) to be dispersed therein. Component (D) may be dispersed by a disperser such as a homogenizer, a disper or a beads mill.

Next, the resin composition in the varnish state (in Stage A) is impregnated into the woven fabric base 5 and then heated and dried to a semi-cured state (in Stage B), thereby producing the prepreg 1 shown in FIG. 1.

[Metal-Clad Laminate]

Figure 3:
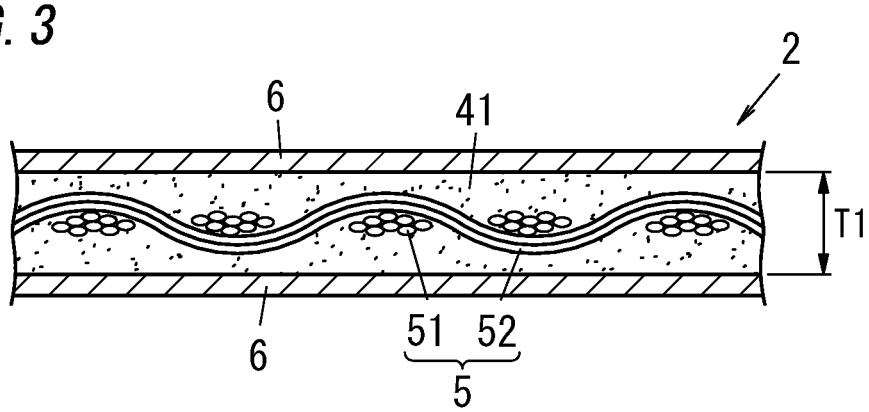
FIG. 3 is a schematic cross-sectional view illustrating a metal-clad laminate according to an embodiment of the present disclosure.

The metal-clad laminate 2 according to this embodiment includes a cured product of the prepreg 1 and at least one metal layer 6 provided for the cured product. Specifically, the metal-clad laminate 2 is formed by providing the metal layer 6 on the surface of an insulating layer 41, which has been formed by curing the prepreg 1 (more particularly, a semi-cured product 4 of the resin composition) as shown in FIG. 3.

Specific examples of the metal layer 6 include metal foil. The metal layer 6 may be configured as ultrathin metal foil (such as ultrathin copper foil) of so-called "ultrathin metal foil with a carrier." The ultrathin metal foil with a carrier has a triple layer structure. Specifically, the ultrathin metal foil with a carrier includes: a carrier; a peelable layer provided on the surface of the carrier; and ultrathin metal foil provided on the surface of the peelable layer. The ultrathin metal foil is too thin to be handled by itself, and is naturally thinner than the carrier. The carrier is metal foil (such as copper foil) that plays the role of protecting and supporting the ultrathin metal foil. The ultrathin metal foil with the carrier is thick enough to be handled easily. The thicknesses of the ultrathin metal foil and carrier are not particularly limited. The ultrathin metal foil may have a thickness falling within the range from 1 μm to 5 μm, for example. The carrier may have a thickness falling within the range from 18 μm to 35 μm, for example. The ultrathin metal foil may be peeled as needed off the carrier.

The metal layer 6 may be formed by any of a physical vapor deposition (PVD) process, a chemical vapor deposition (CVD) process, or a liquid phase deposition (such as plating). In the following description, an exemplary method of forming the metal layer 6 using metal foil will be described.

When the metal-clad laminate 2 is fabricated, multiple sheets of metal foil may be stacked one on top of another and formed into a desired shape on one or both sides of a single prepreg 1. Alternatively, a plurality of prepregs 1 may be stacked one on top of another and multiple sheets of metal foil may be stacked one on top of another and formed into a desired shape on one or both sides of the stack of prepregs 1. When heated, the prepreg 1 in the semi-cured state turns into the insulating layer 41 in the cured state as described above. The moisture-heat resistance of the metal-clad laminate 2 are improvable not only when the insulating layer 41 has a thickness T1 less than 0.2 mm but also when the insulating layer 41 has a thickness T1 of 0.2 mm or more. The thickness T1 of the insulating layer 41 of the metal-clad laminate 2 has an upper limit of about 0.4 mm. Copper foil may be used as exemplary metal foil. The stacking and forming processes may be performed under heat and pressure using a multi-stage vacuum press or a double belt process, for example.

When the metal-clad laminate 2 is fabricated, ultrathin metal foil with a carrier may be used. Specifically, in that case, multiple sheets of ultrathin metal foil with a carrier may be stacked one on top of another and formed into a desired shape on one or both sides of a single prepreg 1. Alternatively, a plurality of prepregs 1 may be stacked one on top of another and multiple sheets of ultrathin metal foil with a carrier may be stacked one on top of another and formed into a desired shape on one or both sides of the stack of prepregs 1. In that case, the ultrathin metal foil of the ultrathin metal foil with a carrier is stacked on the surface of the prepreg 1. After the stacking and forming processes have been performed, the carrier is peeled off the ultrathin metal foil. The ultrathin metal foil has been bonded as the metal layer 6 onto the surface of the insulating layer 41, which is a cured product of the prepreg 1. The peelable layer is suitably peeled along with the carrier so as not to be left on the surface of the ultrathin metal foil. However, even when left there, any fragment of the peelable layer is easily removable. The ultrathin metal foil bonded onto the surface of the insulating layer 41 is usable as a seed layer in a modified semi additive process (MSAP) (see, for example, FIG. 7A). A patterned conductor may be formed by subjecting the seed layer to an electroplating process. The modified semi additive process will be described in further detail later.

The insulating layer 41 of the metal-clad laminate 2 is made of a cured product of the resin composition containing Component (A), thus realizing a low dielectric constant and a low dielectric loss tangent.

[Printed Wiring Board]

Figure 4:
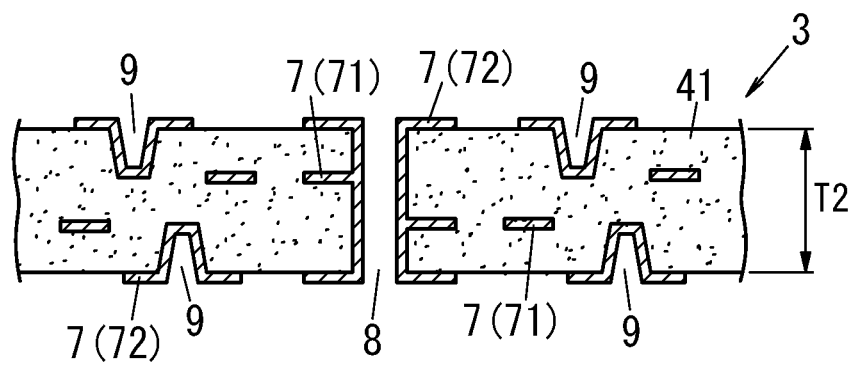
FIG. 4 is a schematic cross-sectional view illustrating a printed wiring board according to an embodiment of the present disclosure.

A printed wiring board 3 according to this embodiment includes a cured product of the prepreg 1 and a patterned conductor 7 provided for the cured product. The patterned conductor 7 may be formed by partially removing the metal layer 6 of the metal-clad laminate 2. The patterned conductor 7 may be formed by a subtractive process, for example. Alternatively, the patterned conductor 7 may also be formed by an additive process, for example, on the surface, not covered with the metal layer 6, of the insulating layer 41. An example of the printed wiring board 3 is shown in FIG. 4. This printed wiring board 3 is a multilayer printed wiring board, of which the patterned conductor 7 has been formed by the subtractive process and which has a multilayer structure formed by a build-up process. One element, provided inside of the insulating layer 41, of the patterned conductor 7 is an internal pattern element 71, and another element, provided on an outer surface of the insulating layer 41, of the patterned conductor 7 is an external pattern element 72. This improves the moisture-heat resistance of the printed wiring board 3 not only when the insulating layer 41 has a thickness T2 less than 0.2 mm but also when the insulating layer 41 has a thickness T2 of 0.2 mm or more. The thickness T2 of the insulating layer 41 of the printed wiring board 3 has an upper limit of about 0.4 mm. In FIG. 4, illustration of the woven fabric base 5 is omitted.

When the patterned conductor 7 is formed, holes are cut through the insulating layer 41 for interconnection purposes. As used herein, "interconnection" refers to making multiple elements in different layers of the patterned conductor 7 electrically conductive with each other. Each of those holes may be a through hole running through the printed wiring board 3 or a blind hole that does not run through the printed wiring board 3. As shown in FIG. 4, a via hole 8 may be formed by plating an inner surface of a through hole, and a blind via hole 9 may be formed by plating an inner surface of a non-through hole. Although not shown, a buried via hole may also be provided. Each hole may have a diameter falling within the range from 0.01 mm to 0.20 mm, for example, and have a depth falling within the range from 0.02 mm to 0.80 mm, for example. The holes may be cut by drilling or laser cutting, for example.

The insulating layer 41 of the printed wiring board 3 is made of a cured product of the resin composition containing Component (A), thus realizing a low dielectric constant and a low dielectric loss tangent. Thus, transmitting signals through the patterned conductor 7 would increase the propagation rate of the signals and would cut down the transmission loss of signals even when the frequency of radio waves used is shifted to a high frequency range. In addition, Component (A) also has excellent heat resistance, thus improving the heat resistance of the printed wiring board 3 as well. Besides, Component (A) has better flame retardant properties than an epoxy resin, thus improving the flame retardant properties of the printed wiring board 3, too.

In this case, adding Components (D1) and (D2) as fillers to the insulating layer 1 would reduce the etch depth at the time of the desmear process because the functional group at the end of the aliphatic alkyl group of the silane coupling agents is an isocyanate group, a glycidyl group, an amino group, a methacryloyl group, or a vinyl group. Also, even if any resin smears are left in the holes, the resin smears are further removable from the holes through cleaning of the holes by a type of desmear process such as chemical hole cleaning. This would significantly reduce the chances of electrical conductivity being seriously affected by those resin smears, thus improving the reliability of electrical conduction.

Furthermore, adding Components (D1) and (D2) as fillers to the insulating layer 41 allows the aliphatic alkyl group of the silane coupling agents to serve as a stress relieving layer, thus lowering the elasticity of the printed wiring board 3 while reducing its coefficient of thermal expansion and imparting an excellent elongation characteristic thereto as well. This would further improve the moisture-heat resistance of the printed wiring board 3.

Next, two methods that may be used to form the blind via holes 9 will be described. The two methods are the semi additive process (SAP) and the modified semi additive process (MSAP).

First, the SAP will be described with reference to FIGS. 5A-5G.

Figure 5A:
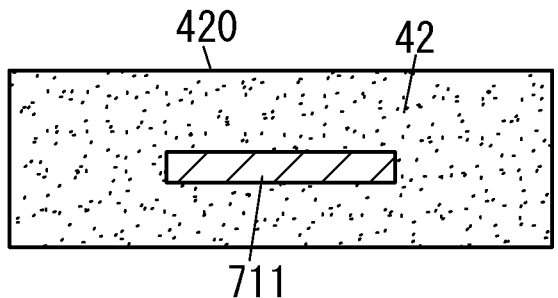
FIGS. 5A-5G are schematic cross-sectional views illustrating a series of process steps of a semi-additive process.

FIG. 5A illustrates an insulating layer 42 including an internal pattern element 711 inside and having a principal surface 420 outside.

Figure 5B:
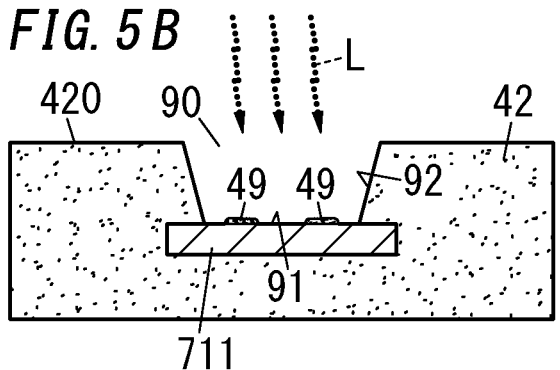

First of all, a non-through hole 90 is formed by cutting a hole halfway through the insulating layer 42 as shown in FIG. 5B. The hole may be formed by laser cutting, for example. Specific examples of the laser beam L include a $CO_2$ laser beam and a UV-YAG laser beam. The non-through hole 90 is cut open through the principal surface 420 of the insulating layer 42. The bottom 91 of the non-through hole 90 is the surface of the internal pattern element 711. While the hole is being cut, resin smears 49 are produced and deposited on the surface of the internal pattern element 711 that is the bottom 91 of the non-through hole 90.

Figure 5C:
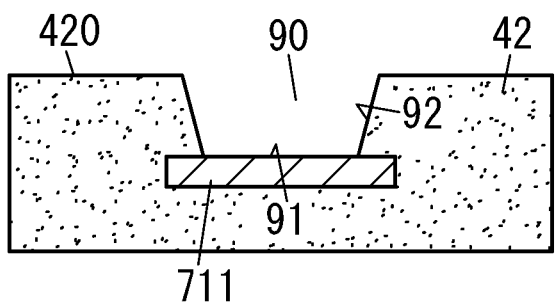

Next, to remove the resin smears 49, a desmear process is carried out as shown in FIG. 5C. The desmear process makes the principal surface 420 of the insulating layer 42 and an inner side surface 92 and bottom 91 of the non-through hole 90 roughened, and also allows the resin smears 49 to be removed from the bottom 91 and inner side surface 92 of the non-through hole 90.

Figure 5D:
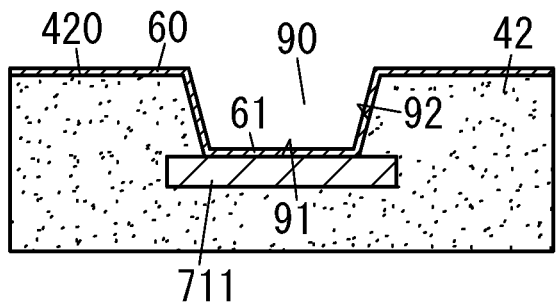

Thereafter, as shown in FIG. 5D, the principal surface 420 of the insulating layer 42 and the bottom 91 and inner side surface 92 of the non-through hole 90 are subjected to an electroless plating process, thereby forming an electroless plating layer 61 that will be a seed layer 60.

Figure 5E:
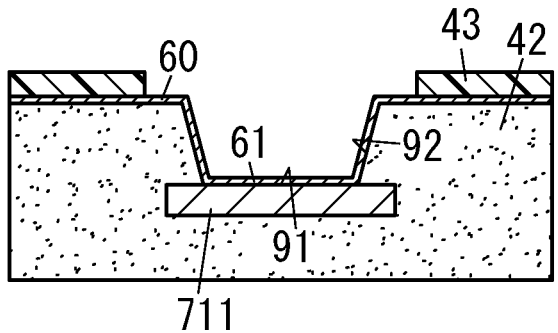

Subsequently, as shown in FIG. 5E, a plating resist mask 43 is formed on the principal surface 420 of the insulating layer 42. The plating resist mask 43 masks portions, which will not be covered with an external pattern element 721, of the principal surface 420 of the insulating layer 42.

Figure 5F:
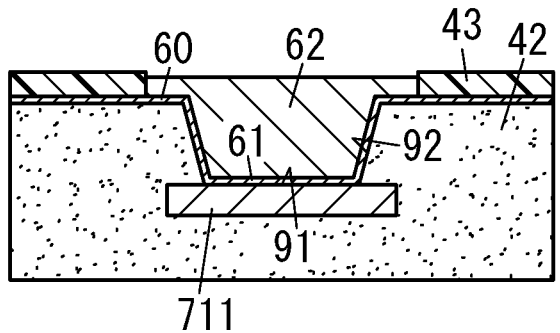

Then, as shown in FIG. 5F, an electroplating process is carried out to fill those portions, not masked with the plating resist mask 43, with a plating metal 62.

Figure 5G:
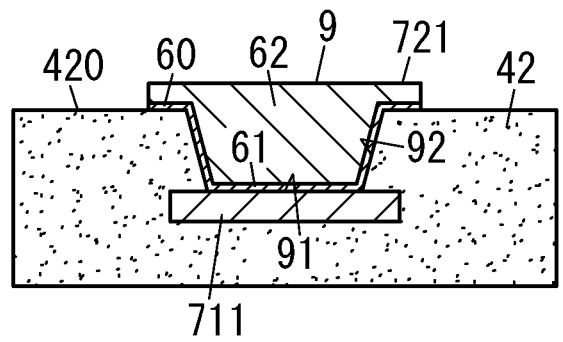

Thereafter, as shown in FIG. 5G, the plating resist mask 43 is removed and a portion, interposed between the plating resist mask 43 and the principal surface 420 of the insulating layer 42, of the seed layer 60 is etched away. In this manner, a blind via hole 9, which electrically connects the internal pattern element 711 to the external pattern element 721, is formed. In particular, the blind via hole 9 is filled with the plating metal 62, and therefore, is also called a "filled via."

In this example, the insulating layer 42 contains both of Components (D1) and (D2) as fillers. However, this is only an example and should not be construed as limiting. Alternatively, the insulating layer 42 may contain neither of these components.

Figure 6A:
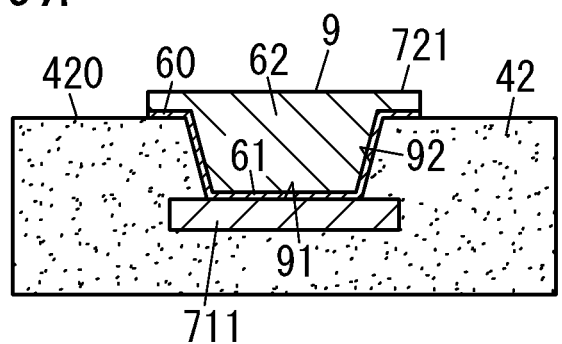
FIG. 6A is a schematic cross-sectional view illustrating a state where no resin smears are left between an internal pattern and a plating after the semi-additive process has been carries out.
Figure 6B:
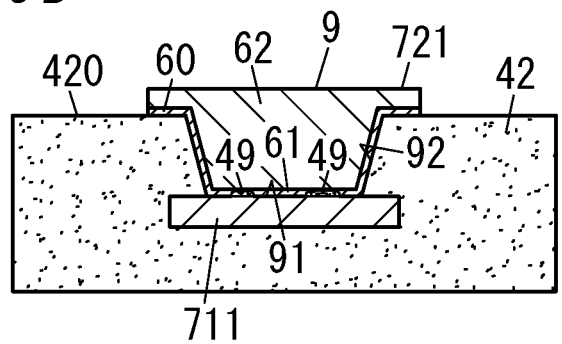
FIG. 6B is a schematic cross-sectional view illustrating a state where some resin smears are left between the internal pattern and the plating after the semi-additive process has been carries out.

In the latter case, i.e., if the insulating layer 42 contains neither Component (D1) nor Component (D2) as a filler, a filled via may be formed with some resin smears 49 left between the internal pattern element 711 and the electroless plating layer 61 as shown in FIG. 6B after the SAP has been carried out. These resin smears 49 are residual ones that have not been removed even by the desmear process.

In contrast, in the former case, i.e., if the insulating layer 42 contains both of Components (D1) and (D2) as fillers, a filled via may be formed with no resin smears 49 left between the internal pattern element 711 and the electroless plating layer 61 as shown in FIG. 6A after the SAP has been carried out. That is to say, the resin smears 49 are easily removable by the desmear process. This would significantly reduce the chances of electrical conductivity being seriously affected by the resin smears 49, thus improving the reliability of electrical conduction. Note that the phrase "no resin smears 49 left" refers herein to not only a situation where literally no resin smears 49 are left at all but also a situation where very few resin smears 49 are left to the point of hardly affecting the reliability of electrical conduction.

Next, the MSAP will be described with reference to FIGS. 7A-7G.

FIG. 7A illustrates an insulating layer 42 including an internal pattern element 711 inside and having a principal surface 420 outside. The principal surface 420 is covered with ultrathin metal foil 63 that will be a first seed layer 601.

First of all, a non-through hole 90 is formed by cutting a hole halfway through the insulating layer 42, as well as through the first seed layer 601, as shown in FIG. 7B. The hole may be formed by laser cutting, for example. Specific examples of the laser beam L include a $CO_2$ laser beam and a UV-YAG laser beam. The non-through hole 90 is cut open through the principal surface 420 of the insulating layer 42. The bottom 91 of the non-through hole 90 is the surface of the internal pattern element 711. While the hole is being cut, resin smears 49 are produced and deposited on the surface of the internal pattern element 711 that is the bottom 91 of the non-through hole 90.

Next, to remove the resin smears 49, a desmear process is carried out as shown in FIG. 7C. The desmear process makes the first seed layer 601 on the principal surface 420 of the insulating layer 42 and an inner side surface 92 and bottom 91 of the non-through hole 90 roughened, and also allows the resin smears 49 to be removed from the bottom 91 and inner side surface 92 of the non-through hole 90.

Thereafter, as shown in FIG. 7D, the first seed layer 601 on the principal surface 420 of the insulating layer 42 and the bottom 91 and inner side surface 92 of the non-through hole 90 are subjected to an electroless plating process, thereby forming an electroless plating layer 61 that will be a second seed layer 602.

Subsequently, as shown in FIG. 7E, a plating resist mask 43 is formed on the principal surface 420 of the insulating layer 42. The plating resist mask 43 masks portions, which will not be covered with an external pattern element 721, of the principal surface 420 of the insulating layer 42.

Then, as shown in FIG. 7F, an electroplating process is carried out to fill those portions, not masked with the plating resist mask 43, with a plating metal 62.

Thereafter, as shown in FIG. 7G, the plating resist mask 43 is removed and portions, interposed between the plating resist mask 43 and the principal surface 420 of the insulating layer 42, of the first and second seed layers 601 and 602 are etched away. In this manner, a blind via hole 9, which electrically connects the internal pattern element 711 to the external pattern element 721, is formed.

In this example, the insulating layer 42 contains both of Components (D1) and (D2) as fillers. However, this is only an example and should not be construed as limiting. Alternatively, the insulating layer 42 may contain neither of these components.

Figure 8A:
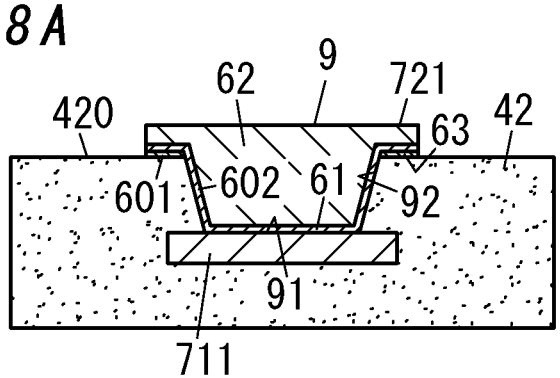
FIG. 8A is a schematic cross-sectional view illustrating a state where no resin smears are left between an internal pattern and a plating after the modified semi-additive process has been carries out.
Figure 8B:
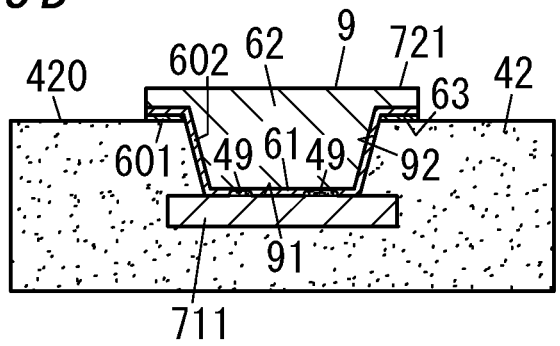
FIG. 8B is a schematic cross-sectional view illustrating a state where some resin smears are left between the internal pattern and the plating after the modified semi-additive process has been carries out.

In the latter case, i.e., if the insulating layer 42 contains neither Component (D1) nor Component (D2) as a filler, a filled via may be formed with some resin smears 49 left between the internal pattern element 711 and the electroless plating layer 61 as shown in FIG. 8B after the MSAP has been carried out. These resin smears 49 are residual ones that have not been removed even by the desmear process.

In contrast, in the former case, i.e., if the insulating layer 42 contains both of Components (D1) and (D2) as fillers, a filled via may be formed with no resin smears 49 left between the internal pattern element 711 and the electroless plating layer 61 as shown in FIG. 8A after the MSAP has been carried out. That is to say, the resin smears 49 are easily removable by the desmear process. This would significantly reduce the chances of electrical conductivity being seriously affected by the resin smears 49, thus improving the reliability of electrical conduction. Note that the phrase "no resin smears 49 left" refers herein to not only a situation where literally no resin smears 49 are left at all but also a situation where very few resin smears 49 are left to the point of hardly affecting the reliability of electrical conduction.

[Package]

A package such as fine pitch ball grid array (FBGA) may be fabricated by integrating semiconductor devices together on the printed wiring board 3 and encapsulating them with a molding compound. Optionally, using the package thus obtained as a sub-package and stacking multiple sub-packages one on top of another also allows a package such as a package on package (PoP) to be fabricated. As can be seen, this embodiment allows various forms of packages to be fabricated. In any of these packages, Components (A), (C), and (B) added thereto not only reduce the warpage but also improve the moisture-heat resistance as well. That is to say, Components (A) and (C) increase the rigidity and Component (B) decreases the elasticity and relieves the stress, thus reducing the warpage of any type of packages generally. In addition, Components (A), (C), and (B) improve the moisture-heat resistance of the package as well.

The insulating layer 41 of the printed wiring board 3 that form part of the package is made of a cured product of the resin composition containing Component (A), thus realizing a low dielectric constant and a low dielectric loss tangent. Thus, transmitting signals through the patterned conductor 7 of the printed wiring board 3 would increase the propagation rate of the signals and would cut down the transmission loss of signals even when the frequency of radio waves used is shifted to a high frequency range. In addition, Component (A) also has excellent heat resistance, thus improving the heat resistance of the printed wiring board 3 as well. Besides, Component (A) has better flame retardant properties than an epoxy resin, thus improving the flame retardant properties of the printed wiring board 3, too.

EXAMPLES

Next, the present disclosure will be described specifically by way of specific examples. Note that the examples to be described below are only examples of the present disclosure and should not be construed as limiting.

<Varnish Composition>

Component (A)

Phenyl methane maleimide (BMI-2300 manufactured by Daiwa Kasei Industry Co., Ltd.)

This includes a diamino diphenyl methane skeleton. The equivalent of the maleimide group is 181 g/eq.

Biphenyl skeleton containing maleimide resin (MIR-3000 manufactured by Nippon Kayaku Co., Ltd.) The equivalent of the maleimide group is 339 g/eq.

Component (B)

Acrylic resin (PMS-12-107 manufactured by Nagase ChemteX Corporation)

This has structures expressed by Formulae (b1), (b2), and (b3), has no unsaturated bonds between adjacent carbon atoms, and has a weight average molecular weight of 50,000, an epoxy value of 0.21 eq/kg, and an epoxy group equivalent of 4762 g/eq.

Acrylic resin (PMS-12-105 manufactured by Nagase ChemteX Corporation)

This has structures expressed by Formulae (b1), (b2), and (b3), has no unsaturated bonds between adjacent carbon atoms, and has a weight average molecular weight of 200,000, an epoxy value of 0.21 eq/kg, and an epoxy group equivalent of 4762 g/eq.

Acrylic resin (PASR-001 manufactured by Nagase ChemteX Corporation)

This has structures expressed by Formulae (b1), (b2), and (b3), has no unsaturated bonds between adjacent carbon atoms, and has a weight average molecular weight of 500,000, an epoxy value of 0.21 eq/kg, and an epoxy group equivalent of 4762 g/eq.

Acrylic resin (SG-70L manufactured by Nagase ChemteX Corporation)

This includes no epoxy groups and has a weight average molecular weight of 900,000.

Component (C)

Naphthalene skeleton containing phenol resin (HPC-9500P manufactured by DIC Corporation)

This has a hydroxy group equivalent of 153 g/eq.

Allyl phenol resin (MEH-8000H manufactured by Meiwa Plastic Industries, Ltd.)

This has a hydroxy group equivalent of 140 g/eq.

Phosphorus-containing phenol resin (HPC-9080 manufactured by DIC Corporation)

This has a hydroxy group equivalent of 249 g/eq.

Phenol novolak resin (TD-2090 manufactured by DIC Corporation)

This has a hydroxy group equivalent of 105 g/eq.

Components (D)

Component (D1)

Epoxy silane treated silica

This is a spherical silica ($S_C$2500SEJ manufactured by Admatecs) subjected to surface treatment with 3-glycidoxypropyltrimethoxy silane and has a mean particle size of 0.5 μm (=500 nm).

Isocyanate silane treated silica

This is a spherical silica ($S_C$2500GNO manufactured by Admatecs) subjected to surface treatment with 3-isocyanatepropyltriethoxy silane and has a mean particle size of 0.5 μm (=500 nm).

Component (D2)

Methacrylic silane treated silica

This is a spherical silica (YA050C-MJE manufactured by Admatecs) subjected to surface treatment with 3-methacryloxypropyltrimethoxy silane and has a mean particle size of 50 nm.

(Other Resins)

Naphthalene skeleton containing epoxy resin (HP-9500 manufactured by DIC Corporation)

This has an epoxy value of 4.35 eq/kg and an epoxy group equivalent of 230 g/eq.

(Curing Accelerator)

2-ethyl-4-methyl imidazole (2E4MZ manufactured by Shikoku Chemicals Corporation)

Triphenylphosphine (TPP manufactured by Wako Pure Chemical Corporation)

Tetraphenylphosphonium tetra-p-tolylborate (TPP-MK manufactured by Hokko Chemical Industry Co., Ltd.)

(Additive)

Phosphorus-based flame retardant (SPB-100 manufactured by Otsuka Chemical Co., Ltd.)

(Solvent)

Methyl ethyl ketone

<Prepreg>

Components (A), (B), and (C) and other resins were added to, and dissolved in, a solvent to have the compositions (parts by mass) shown in Tables 1 and 2. Thereafter, a curing accelerator and an additive were added to the mixture and compounded together. Next, Components (D) were added thereto and allowed to be dispersed in the mixture to prepare a varnish of a resin composition.

Next, the varnish of the resin composition was impregnated into a woven fabric base (glass cloth 2116 manufactured by Nitto Bosch Co., Ltd.) and heated and dried at 130° C. for 5 minutes to a semi-cured state, thereby fabricating a prepreg with a thickness of 100 μm.

<Metal-Clad Laminate>

Two prepregs with such a structure were stacked one on top of the other and copper foil (with a thickness of 12 μm) was stacked as metal foil on each of the two surfaces of the stack. Then, the assembly was heated at 220° C. for 60 minutes and formed into a desired shape with a pressure of 3 MPa applied thereto in a vacuum, thereby fabricating a copper-clad laminate (CCL) as a metal-clad laminate. The insulating layer of the metal-clad laminate had a thickness of 200 μm. Furthermore, an unclad plate with a thickness of 0.2 mm was obtained by etching away the metal foil from both surfaces of the metal-clad laminate.

TABLE 1

| | | | Product Code | Manufactured by | Contains | Ex1 | Ex2 | Ex3 | Ex4 | Ex5 |
|---|---|---|---|---|---|---|---|---|---|---|
| Varnish Composition | Component (A) | | BMI-2300 | Daiwa Kasei Industry Co., Ltd. | Phenyl methane maleimide | 40 | 40 | 0 | 40 | 40 |
| | | | MIR-3000 | Nippon Kayaku Co., Ltd. | Biphenyl skeleton containing maleimide resin | 0 | 0 | 50 | 0 | 0 |
| | Component (B) | | PMS-12-107 | Nagase ChemteX Corporation | Acrylic resin with Mw of 50,000 | 0 | 0 | 0 | 0 | 0 |
| | | | PMS-12-105 | Nagase ChemteX Corporation | Acrylic resin with Mw of 200,000 | 0 | 0 | 0 | 0 | 30 |
| | | | PASR-001 | Nagase ChemteX Corporation | Acrylic resin with Mw of 500,000 | 30 | 30 | 30 | 30 | 0 |
| | | | SG-70L | Nagase ChemteX Corporation | Acrylic resin with Mw of 900,000 (with no epoxy groups) | 0 | 0 | 0 | 0 | 0 |
| | Component (C) | | HPC-9500P | DIC | Naphthalene skeleton containing phenol resin | 30 | 30 | 20 | 0 | 30 |
| | | | MEH-8000H | Meiwa Plastic Industries, Ltd. | Allyl phenol resin | 0 | 0 | 0 | 10 | 0 |
| | | | HPC-9080 | DIC | Phosphorus-containing phenol resin | 0 | 0 | 0 | 20 | 0 |
| | | | TD-2090 | DIC | Phenol novolak resin | 0 | 0 | 0 | 0 | 0 |
| | Component (D) | (D1) | SC2500SEJ | Admatecs | Epoxy silane treated silica | 0 | 50 | 0 | 0 | 0 |
| | | | SC2500GNO | Admatecs | Isocyanate silane treated silica | 0 | 0 | 0 | 0 | 0 |
| | | (D2) | YA050C-MJE | Admatecs | Methacrylic silane treated silica | 0 | 0 | 0 | 0 | 0 |
| | Other resins | | HP-9500 | DIC | Naphthalene skeleton containing epoxy resin | 0 | 0 | 0 | 0 | 0 |
| | Curing Accelerator | | 2E4MZ | Shikoku Chemicals Corporation | 2-ethyl-4-methyl imidazole | 0.08 | 0.08 | 0 | 0 | 0 |
| | | | TPP | Wako Pure Chemical Corporation | Triphenylphosphine | 0 | 0 | 0.5 | 0.3 | 0.3 |
| | | | TPP-MK | Hokko Chemical Industry Co., Ltd. | Tetraphenylphosphonium tetra-p-tolylborate | 0 | 0 | 0 | 0 | 0 |
| | Additive | | SPB-100 | Otsuka Chemical Co., Ltd. | Phosphorus-based flame retardant | 0 | 0 | 0 | 0 | 0 |
| | Solvent | | MEK | — | Methyl ethyl ketone | 150 | 150 | 150 | 150 | 150 |
| (C)/((A) + (B)): ratio of equivalent of Component (C) to total equivalent of Components (A) and (B) | | | | | | 0.86 | 0.86 | 0.85 | 0.67 | 0.86 |

| | | | Product Code | Manufactured by | Contains | Ex6 | Ex7 | Ex8 | Ex9 | Ex10 |
|---|---|---|---|---|---|---|---|---|---|---|
| Varnish Composition | Component (A) | | BMI-2300 | Daiwa Kasei Industry Co., Ltd. | Phenyl methane maleimide | 40 | 46 | 40 | 46 | 40 |
| | | | MIR-3000 | Nippon Kayaku Co., Ltd. | Biphenyl skeleton containing maleimide resin | 0 | 0 | 0 | 0 | 0 |
| | Component (B) | | PMS-12-107 | Nagase ChemteX Corporation | Acrylic resin with Mw of 50,000 | 0 | 0 | 0 | 0 | 0 |
| | | | PMS-12-105 | Nagase ChemteX Corporation | Acrylic resin with Mw of 200,000 | 0 | 0 | 0 | 0 | 0 |
| | | | PASR-001 | Nagase ChemteX Corporation | Acrylic resin with Mw of 500,000 | 30 | 30 | 30 | 30 | 30 |
| | | | SG-70L | Nagase ChemteX Corporation | Acrylic resin with Mw of 900,000 (with no epoxy groups) | 0 | 0 | 0 | 0 | 0 |
| | Component (C) | | HPC-9500P | DIC | Naphthalene skeleton containing phenol resin | 30 | 0 | 30 | 30 | 30 |
| | | | MEH-8000H | Meiwa Plastic Industries, Ltd. | Allyl phenol resin | 0 | 0 | 0 | 0 | 0 |

TABLE 1-continued

|  |  |  | | | | | | | |
|---|---|---|---|---|---|---|---|---|---|
| | | HPC-9080 | DIC | Phosphorus-containing phenol resin | 0 | 0 | 0 | 0 | 0 |
| | | TD-2090 | DIC | Phenol novolak resin | 0 | 24 | 0 | 24 | 0 |
| Component (D) | (D1) | SC2500SEJ | Admatecs | Epoxy silane treated silica | 47 | 47 | 0 | 0 | 0 |
| | | SC2500GNO | Admatecs | Isocyanate silane treated silica | 0 | 0 | 0 | 0 | 47 |
| | (D2) | YA050C-MJE | Admatecs | Methacrylic silane treated silica | 3 | 3 | 0 | 0 | 3 |
| Other resins | | HP-9500 | DIC | Naphthalene skeleton containing epoxy resin | 0 | 0 | 0 | 0 | 0 |
| Curing Accelerator | | 2E4MZ | Shikoku Chemicals Corporation | 2-ethyl-4-methyl imidazole | 0.08 | 0.08 | 0 | 0 | 0.08 |
| | | TPP | Wako Pure Chemical Corporation | Triphenylphosphine | 0 | 0 | 0 | 0 | 0 |
| | | TPP-MK | Hokko Chemical Industry Co., Ltd. | Tetraphenylphosphonium tetra-p-tolylborate | 0 | 0 | 0.5 | 0.5 | 0 |
| Additive | | SPB-100 | Otsuka Chemical Co., Ltd. | Phosphorus-based flame retardant | 0 | 0 | 0 | 0 | 0 |
| Solvent | | MEK | — | Methyl ethyl ketone | 200 | 200 | 150 | 150 | 200 |
| | | (C)/((A) + (B)): ratio of equivalent of Component (C) to total equivalent of Components (A) and (B) | | | 0.86 | 0.91 | 0.86 | 0.91 | 0.86 |

TABLE 2

| | | Product Code | Manufactured by | Contains | Cmp. Ex1 | Cmp. Ex2 | Cmp. Ex3 | Cmp. Ex4 |
|---|---|---|---|---|---|---|---|---|
| Varnish Composition | Component (A) | BMI-2300 | Daiwa Kasei Industry Co., Ltd. | Phenyl methane maleimide | 40 | 0 | 40 | 40 |
| | | MIR-3000 | Nippon Kayaku Co., Ltd. | Biphenyl skeleton containing maleimide resin | 0 | 0 | 0 | 0 |
| | Component (B) | PMS-12-107 | Nagase ChemteX Corporation | Acrylic resin with Mw of 50,000 | 0 | 0 | 30 | 0 |
| | | PMS-12-105 | Nagase ChemteX Corporation | Acrylic resin with Mw of 200,000 | 0 | 0 | 0 | 0 |
| | | PASR-001 | Nagase ChemteX Corporation | Acrylic resin with Mw of 500,000 | 0 | 30 | 0 | 0 |
| | | SG-70L | Nagase ChemteX Corporation | Acrylic resin with Mw of 900,000 (with no epoxy groups) | 0 | 0 | 0 | 30 |
| | Component (C) | HPC-9500P | DIC | Naphthalene skeleton containing phenol resin | 30 | 31 | 0 | 30 |
| | | MEH-8000H | Meiwa Plastic Industries, Ltd. | Allyl phenol resin | 0 | 0 | 0 | 0 |
| | | HPC-9080 | DIC | Phosphorus-containing phenol resin | 0 | 0 | 0 | 0 |
| | | TD-2090 | DIC | Phenol novolak resin | 0 | 0 | 0 | 0 |
| | Component (D) (D1) | SC2500SEJ | Admatecs | Epoxy silane treated silica | 0 | 0 | 0 | 0 |
| | | SC2500GNO | Admatecs | Isocyanate silane treated silica | 0 | 50 | 0 | 0 |
| | (D2) | YA050C-MJE | Admatecs | Methacrylic silane treated silica | 0 | 5 | 0 | 0 |
| | Other resins | HP-9500 | DIC | Naphthalene skeleton containing epoxy resin | 0 | 39 | 0 | 0 |
| | Curing Accelerator | 2E4MZ | Shikoku Chemicals Corporation | 2-ethyl-4-methyl imidazole | 0.08 | 0.08 | 0.08 | 0 |
| | | TPP | Wako Pure Chemical Corporation | Triphenylphosphine | 0 | 0 | 0 | 0.3 |
| | | TPP-MK | Hokko Chemical Industry Co., Ltd. | Tetraphenylphosphonium tetra-p-tolylborate | 0 | 0 | 0 | 0 |
| | Additive | SPB-100 | Otsuka Chemical Co., Ltd. | Phosphorus-based flame retardant | 0 | 19 | 0 | 0 |
| | Solvent | MEK | — | Methyl ethyl ketone | 40 | 190 | 190 | 190 |
| | | (C)/((A) + (B)): ratio of equivalent of Component (C) to total equivalent of Components (A) and (B) | | | 0.88 | 1.15 | — | 0.88 |

<Substrate Properties>

The following physical properties were evaluated. The results are shown in Table 3 and 4.

(Dielectric Constant and Dielectric Loss Tangent)

A test specimen (with dimensions of 2 mm×100 mm) was obtained by cutting out the unclad plate. The dielectric constant (relative dielectric constant) and dielectric loss tangent of the test specimen were measured by a cavity resonator method. The measuring frequency was 10 GHz.

(Warpage of Package)

A substrate (with dimensions of 17 mm×17 mm) was prepared by cutting out the unclad plate.

A semiconductor chip with dimensions of 15 mm×15 mm×0.1 mm (thickness) was further prepared.

Then, the semiconductor chip was bonded onto the substrate with a liquid encapsulant for underfills (CV5300AM manufactured by Panasonic Corporation), thereby obtaining a simple package for use to measure the warpage of the package.

Next, the warpage of the package was measured by using a warpage measurement tool (TherMoiré PS200 manufactured by Akrometrix Corporation) based on the shadow moiré measurement theory. The warpage of the package was obtained as the difference between the maximum and minimum values of coplanarity when the package was heated from room temperature (of about 30° C.) to 260° C. and then cooled to 25° C.

(Peak Top Temperature at which Tan δ≥0.05)

The unclad plate was cut out into a strip with a width of 5 mm in a biasing direction forming a tilt angle of 45 degrees with respect to the warp direction of the woven fabric base, thereby obtaining a sample with a length of 25 mm. This sample was subjected to a dynamic mechanical analysis (DMA) using a dynamic mechanical spectrometer (DMS6100 manufactured by SII Nanotechnology Inc.) under the condition including a chucking interval of 10 mm, a temperature rise rate of 5° C./min, a frequency of 10 Hz, and a tensile mode adopted. A peak top temperature at which tan δ≥0.05 was determined by reading a dielectric loss tangent (tan δ) chart thus obtained.

(Modulus of Elasticity)

A storage modulus of elasticity (E') at room temperature (of 25° C.) was read from the dielectric loss tangent (tan δ) chart obtained by the measurement and regarded as the modulus of elasticity of the sample.

(Coefficient of Thermal Expansion)

The unclad plate was cut out into a strip with a width of 5 mm parallel to the warp direction of the woven fabric base, thereby obtaining a sample with a length of 25 mm. This sample was subjected to a measurement using a thermomechanical analyzer (TMA6100 manufactured by SII Nanotechnology Inc.) under the condition including a probe interval of 15 mm and a tensile load of 5 mN. An average coefficient of thermal expansion was calculated, as the coefficient of thermal expansion (CTE) of the sample, in the range of 50° C. to 100° C. of the expansion curve obtained by this measurement. This coefficient of thermal expansion is a coefficient of thermal expansion (α1) at the glass transition temperature (Tg) or less.

(Tensile Elongation)

The unclad plate was cut out into a strip with a width of 5 mm in a biasing direction forming a tilt angle of 45 degrees with respect to the warp direction of the woven fabric base, thereby obtaining a sample with a length of 80 mm. This sample was subjected to a tensile test using a tensile tester (Autograph AGS-X manufactured by Shimadzu Corporation) under the condition including standard distances of 60 mm and 5 mm/min. The tensile test was conducted at room temperature (of 25° C.). The tensile elongation was calculated by the following equation using an initial sample length ($L_0$) before the tensile test and its length (L) just before the sample was broken at the tensile test:

Tensile elongation (%)={$(L-L_0)/L_0$}×100

(Tensile Breaking Strength) The tensile breaking strength of the sample was calculated by the following equation using a load F (N) when the sample was broken at the tensile test and the cross-sectional area A (mm$^2$) of the sample:

Tensile breaking strength (MPa)=$F(N)/A$ (mm$^2$)

(Heat Resistance)

The copper-clad laminate (CCL) described above was loaded into a thermostat with a temperature adjusted at a predetermined temperature, held there for 60 minutes, and then unloaded from the thermostat to see, with the eyes, if there was any delamination in the CCL. This test was conducted repeatedly with the temperature of the thermostat changed to determine a critical temperature under which no delamination occurred in the CCL.

(Flame Retardant Property)

The sample was subjected to a vertical flame test in accordance with the UL94 standard.

(Desmear Etch Depth)

The desmear etch depth was calculated by the following Equations (3) and (4):

$$M_2 \text{ (mg)} = M_0 \text{ (mg)} - M_1 \text{ (mg)} \tag{3}$$

$$\text{Desmear etch depth (mg/cm}^2\text{)} = M_2 \text{ (mg)}/S_a \text{ (cm}^2\text{)} \tag{4}$$

where $M_0$ is the initial mass (mg) of the sample, $M_1$ is the mass (mg) of the sample subjected to the desmear process, $M_2$ is a decrease in mass (mg), and $S_a$ is the surface area (cm$^2$) of the sample.

Specifically, the desmear etch depth was calculated through the following process steps:

(1) Sample Preparation

A sample was prepared by removing the metal foil from a metal-clad laminate with dimensions of 10 cm×10 cm.

(2) Initial Drying, Cooling, and Measurement of Initial Mass

The sample was dried at 130° C. for 30 minutes by a thermostat dryer and then cooled at room temperature for 120 minutes or more by a dry desiccator. Thereafter, the initial mass $M_0$ (mg) of the sample was measured by an electronic scale.

(3) Swelling

The sample which had had its initial mass measured was dipped in a swelling liquid (including 500 ml/L of Swelling Dip Securiganth P manufactured by Atotech Japan K.K. and 3 g/L of sodium hydroxide aqueous solution) at 60° C. for 5 minutes.

(4) Micro-Etching

The swollen sample was dipped in an oxidant (including 580 ml/L of Concentrate Compact CP manufactured by Atotech Japan K.K. and 40 g/L of sodium hydroxide aqueous solution) at 80° C. for 10 minutes.

(5) Neutralization

The micro-etched sample was dipped in a neutralizing solution (including 70 ml/L of Reduction Solution Securiganth P500 manufactured by Atotech Japan K.K. and 50 ml/L of 98% sulfuric acid) at 40° C. for 5 minutes.

(6) Drying after Treatment, Cooling, and Measurement of Mass of Treated Sample)

The neutralized sample was washed with water, and dried by a dryer. The sample was then dried at 130° C. for 30 minutes by a thermostat dryer and then cooled at room temperature for 120 minutes or more by a dry desiccator. Thereafter, the mass $M_1$ (mg) of the sample subjected to the desmear process was measured by an electronic scale.

TABLE 3

| | | Measured by | Measuring condition | Unit | Ex. 1 | Ex. 2 | Ex. 3 |
|---|---|---|---|---|---|---|---|
| Substrate properties | Dielectric constant | Cavity resonator | 10 GHz | — | 3.9 | 4 | 4 |

TABLE 3-continued

|  |  |  |  |  |  |  |
|---|---|---|---|---|---|---|
| Dielectric loss tangent | Cavity resonator | 10 GHz | — | 0.011 | 0.009 | 0.009 |
| Package warpage | Shadow moiré | Room temperature to 260° C. | μm | 250 | 260 | 250 |
| Peak top temperature at which tanδ ≥ 0.05 | DMA | 10 Hz | ° C. | 65 290 | 65 285 | 60 280 |
| Modulus of elasticity | DMA | Room temperature | GPa | 9 | 9 | 7 |
| Coefficient of thermal expansion | TMA | α1 | ppm/° C. | 5 | 7 | 7 |
| Tensile elongation | Autograph | Room temperature | % | 13 | 9 | 10 |
| Tensile breaking strength | Autograph | Room temperature | MPa | 139 | 123 | 120 |
| Heat resistance | — | 60 minutes | ° C. | 280 | 280 | 280 |
| Flame retardant property | UL94 | Vertical test | — | V-1 | V-1 | V-1 |
| Desmear etch depth | — | — | mg/cm$^2$ | 0.51 | 0.55 | 0.35 |

|  |  | Ex. 4 | Ex. 5 | Ex. 6 | Ex. 7 | Ex. 8 | Ex. 9 | Ex. 10 |
|---|---|---|---|---|---|---|---|---|
| Substrate properties | Dielectric constant | 4 | 4 | 4 | 4 | 3.9 | 4 | 4 |
|  | Dielectric loss tangent | 0.01 | 0.012 | 0.012 | 0.014 | 0.010 | 0.014 | 0.012 |
|  | Package warpage | 260 | 265 | 265 | 265 | 255 | 250 | 265 |
|  | Peak top temperature at which tanδ ≥ 0.05 | 50 290 | 65 280 | 65 285 | 50 265 | 65 295 | 52 275 | 62 282 |
|  | Modulus of elasticity | 7 | 9 | 9 | 9 | 8 | 9 | 9 |
|  | Coefficient of thermal expansion | 7 | 7 | 7 | 7 | 7 | 7 | 7 |
|  | Tensile elongation | 11 | 8 | 8 | 8 | 10 | 10 | 8 |
|  | Tensile breaking strength | 124 | 140 | 142 | 142 | 125 | 125 | 142 |
|  | Heat resistance | 280 | 270 | 280 | 280 | 280 | 290 | 280 |
|  | Flame retardant property | V-0 | V-1 | V-1 | V-1 | V-1 | V-1 | V-1 |
|  | Desmear etch depth | 0.45 | 0.48 | 0.57 | 0.33 | 0.47 | 0.22 | 0.52 |

TABLE 4

|  |  | Measured by | Measuring condition | Unit | Cmp Ex. 1 | Cmp Ex. 2 | Cmp Ex. 3 | Cmp Ex. 4 |
|---|---|---|---|---|---|---|---|---|
| Substrate properties | Dielectric constant | Cavity resonator | 10 GHz | — | 4 | 4.4 | 4.4 | 4 |
|  | Dielectric loss tangent | Cavity resonator | 10 GHz | — | 0.01 | 0.016 | 0.014 | 0.01 |
|  | Package warpage | Shadow moiré | Room temperature to 260° C. | μm | 540 | 290 | 310 | 310 |
|  | Peak top temperature at which tanδ ≥ 0.05 | DMA | 10 Hz | ° C. | 294 | 30 246 | 30 282 | 10 280 |
|  | Modulus of elasticity | DMA | Room temperature | GPa | 13 | 13 | 10 | 10 |
|  | Coefficient of thermal expansion | TMA | 50-100° C. | ppm/° C. | 12 | 6.8 | 6.9 | 15 |
|  | Tensile elongation | Autograph | Room temperature | % | 5 | 10 | 5 | 6 |
|  | Tensile breaking strength | Autograph | Room temperature | MPa | 180 | 150 | 100 | 105 |
|  | Heat resistance | — | 60 minutes | ° C. | 280 | 280 | 270 | 270 |
|  | Flame retardant property | UL94 | Vertical test | — | V-1 | V-0 | V-1 | V-1 |
|  | Desmear etch depth | — | — | mg/cm$^2$ | 0.58 | 0.50 | 0.24 | 0.70 |

As is clear from Table 3 and 4, it was confirmed that reduction in the warpage of the package and improvement of the dielectric property were both achieved in Examples 1-10, as opposed to Comparative Examples 1-4.

Comparing the results of Examples 1 and 8 with each other, it can be seen that using tetraphenylphosphonium tetra-p-tolylborate as a curing accelerator instead of 2-ethyl-4-methyl imidazole caused a shift of the main dispersion peak of the tan δ curve toward a high-temperature range (i.e., caused an increase in Tg).

Comparing the results of Examples 8 and 9, it can be seen that adding a phenol novolak resin as Component (C) to the resin composition of Example 8 caused a decrease in desmear etch depth.

REFERENCE SIGNS LIST

1 Prepreg
2 Metal-Clad Laminate
3 Printed Wiring Board
4 Semi-Cured Product
5 Woven Fabric Base
6 Metal Layer
7 Patterned Conductor
51 Warp
52 Woof

The invention claimed is:

1. A prepreg comprising:
a woven fabric base; and
a semi-cured product of a resin composition impregnated into the woven fabric base,
the resin composition containing a maleimide resin as Component (A), an acrylic resin as Component (B), and a phenol resin as Component (C),
the Component (B) having structures expressed by at least Formulae (b2) and (b3), respectively, among the following Formulae (b1), (b2), and (b3) and having a weight average molecular weight falling within the range from 200,000 to 850,000,

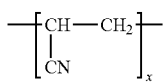  (b1)

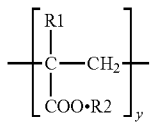  (b2)

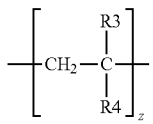  (b3)

where x in Formula (b1), y in Formula (b2), and z in Formula (b3) satisfy the following relation x:y:z (in mole fractions)=0:0.95:0.05 to 0.2:0.6:0.2 (where x+y+z≤1, 0≤x≤0.2, 0.6≤y≤0.95, and 0.05≤z≤0.2); in Formula (b2), R1 is either a hydrogen atom or a methyl group and R2 is selected from the group consisting of a hydrogen atom, an alkyl group, a glycidyl group, and an epoxidized alkyl group and includes at least one of the glycidyl group or the epoxidized alkyl group; and in Formula (b3), R3 is either a hydrogen atom or a methyl group, and R4 is Ph (a phenyl group), —COOCH$_2$Ph, or —COO(CH$_2$)$_2$Ph.

2. The prepreg of claim 1, wherein
the Component (A) includes one or more skeletons selected from the group consisting of a phenyl methane skeleton, an alkylated phenyl methane skeleton, and a biphenyl skeleton.

3. The prepreg of claim 1, wherein
the Component (C) includes one or more resins selected from the group consisting of a naphthalene skeleton containing phenol resin, a naphthalene skeleton containing cresol resin, a biphenyl skeleton containing phenol resin, a biphenyl skeleton containing cresol resin, and an allyl phenol resin.

4. The prepreg of claim 1, wherein
a ratio of an equivalent of the Component (C) to a total equivalent of the Components (A) and (B) falls within the range from 0.8:1 to 1.2:1.

5. The prepreg of claim 1, wherein
the resin composition further contains an inorganic filler as Component (D).

6. The prepreg of claim 1, wherein
the prepreg in a cured state has a loss modulus of elasticity to storage modulus of elasticity ratio that is equal to or greater than 0.05 in a temperature range of 100° C. or less and in a temperature range of 200° C. or more.

7. The prepreg of claim 1, wherein
the prepreg in a cured state has a tensile elongation of 5% or more in a direction forming a tilt angle of 45 degrees with respect to a warp or woof of the woven fabric base.

8. A metal-clad laminate comprising:
a cured product of the prepreg of claim 1; and
a metal layer provided for the cured product.

9. A printed wiring board comprising:
a cured product of the prepreg of claim 1; and
a patterned conductor provided for the cured product.

* * * * *